(12) United States Patent
Kojo

(10) Patent No.: US 11,165,390 B2
(45) Date of Patent: Nov. 2, 2021

(54) PIEZOELECTRIC RESONATOR DEVICE

(71) Applicant: Daishinku Corporation, Kakogawa (JP)

(72) Inventor: Takuya Kojo, Kakogawa (JP)

(73) Assignee: Daishinku Corporation, Kakogawa (JP)

(*) Notice: Subject to any disclaimer, the term of this patent is extended or adjusted under 35 U.S.C. 154(b) by 999 days.

(21) Appl. No.: 15/580,695

(22) PCT Filed: Jun. 1, 2016

(86) PCT No.: PCT/JP2016/066252
§ 371 (c)(1),
(2) Date: Dec. 8, 2017

(87) PCT Pub. No.: WO2016/199645
PCT Pub. Date: Dec. 15, 2016

(65) Prior Publication Data
US 2018/0191303 A1 Jul. 5, 2018

(30) Foreign Application Priority Data
Jun. 12, 2015 (JP) .............................. JP2015-119039

(51) Int. Cl.
*H03B 5/32* (2006.01)
*H03H 9/19* (2006.01)
(Continued)

(52) U.S. Cl.
CPC ............. *H03B 5/32* (2013.01); *H03H 9/0547* (2013.01); *H03H 9/0595* (2013.01);
(Continued)

(58) Field of Classification Search
CPC .......... H03B 5/32; H03H 9/19; H03H 9/1035; H03H 9/0547; H03H 9/0595; H03H 9/178; H03H 3/02
(Continued)

(56) References Cited

U.S. PATENT DOCUMENTS 10,600,953 B2 * 3/2020 Kojo ..................... H01L 41/047
2012/0133447 A1 5/2012 Mizusawa
(Continued)

FOREIGN PATENT DOCUMENTS

| CN | 102474237 A | 5/2012 |
| JP | 2010-252051 A | 11/2010 |

*Primary Examiner* — Arnold M Kinkead
(74) *Attorney, Agent, or Firm* — Metrolex IP Law Group, PLLC

(57) ABSTRACT

A piezoelectric resonator device having a sandwich structure is provided. A crystal oscillator includes: a crystal resonator plate; a first sealing member covering a first excitation electrode of the crystal resonator plate; and a second sealing member covering a second excitation electrode of the crystal resonator plate. A parallelepiped shaped package is formed by bonding: the first sealing member to the crystal resonator plate; and the second sealing member to the crystal resonator plate. The package includes an internal space in which is hermetically sealed a vibrating part of the crystal resonator plate including the first excitation electrode and the second excitation electrode. A bonding material hermetically sealing the vibrating part of the crystal resonator plate is formed to have an annular shape in plan view, and is disposed along an outer peripheral edge of the package.

5 Claims, 8 Drawing Sheets

(51) Int. Cl.
*H03H 9/10* (2006.01)
*H03H 9/05* (2006.01)
*H03H 9/17* (2006.01)
*H03H 3/02* (2006.01)

(52) U.S. Cl.
CPC .......... *H03H 9/1035* (2013.01); *H03H 9/178* (2013.01); *H03H 9/19* (2013.01); *H03H 3/02* (2013.01)

(58) Field of Classification Search
USPC .......................................... 331/158, 154, 68
See application file for complete search history.

(56) References Cited

U.S. PATENT DOCUMENTS

| 2015/0091665 A1* | 4/2015 | Yamamoto | H03H 9/0542 |
| | | | 331/158 |
| 2016/0028369 A1* | 1/2016 | Yamamoto | H03H 9/174 |
| | | | 331/158 |

\* cited by examiner

PIEZOELECTRIC RESONATOR DEVICE

FIELD

The present invention relates to piezoelectric resonator devices.

BACKGROUND ART

Recent years, in various electronic devices, their operating frequencies have increased and their packages (especially, their height) have been downsized. According to such an increase in operating frequency and a reduction in package size, there is also a need for piezoelectric resonator devices (crystal resonators, for example) to be adaptable to the increase in operating frequency and the reduction in package size.

In this kind of piezoelectric resonator devices, a housing is constituted by a rectangular-shaped package. The package is constituted by: a first sealing member and a second sealing member both made of glass or crystal; and a crystal resonator plate made of crystal. On respective main surfaces of the crystal resonator plate, excitation electrodes are formed. The first sealing member and the second sealing member are laminated and bonded via the crystal resonator plate. Thus, the excitation electrodes of the crystal resonator plate that is disposed in the package (in the internal space) are hermetically sealed (for example, see Patent Document 1). Hereinafter, such a laminated structure of the piezoelectric resonator device is referred to as a sandwich structure.

PRIOR ART DOCUMENT

Patent Document

[Patent Document 1] JP 2010-252051 A

SUMMARY OF THE INVENTION

Problem to Be Solved by the Invention

As described above, the downsizing of the piezoelectric resonator devices has been promoted recently. However, in the conventional piezoelectric resonator devices, a sealing part for hermetically sealing a vibrating part of a piezoelectric resonator plate (crystal resonator plate) is formed so that the outer edge thereof has a substantially rectangular shape in plan view. For this reason, it is difficult to efficiently use space at the four corners of the package, which is a main reason for preventing the downsizing of the piezoelectric resonator device.

The present invention was made in consideration of the above circumstances, an object of which is to provide a piezoelectric resonator device having a sandwich structure that can be easily adapted to reduction in size.

Means for Solving the Problem

In order to resolve the above problem, the present invention has the following configuration. That is, the present invention provides a piezoelectric resonator device that includes: a piezoelectric resonator plate including a first excitation electrode formed on a first main surface of a substrate, and a second excitation electrode formed on a second main surface of the substrate, the second excitation electrode making a pair with the first excitation electrode; a first sealing member covering the first excitation electrode of the piezoelectric resonator plate; a second sealing member covering the second excitation electrode of the piezoelectric resonator plate; and a substantially rectangular parallelepiped shaped package formed by bonding the first sealing member to the piezoelectric resonator plate and by bonding the second sealing member to the piezoelectric resonator plate, the package including an internal space in which is hermetically sealed a vibrating part of the piezoelectric resonator plate including the first excitation electrode and the second excitation electrode. A sealing part hermetically sealing the vibrating part of the piezoelectric resonator plate is formed so as to have an annular shape in plan view, and furthermore is disposed along an outer peripheral edge of the package excluding four corners of the package.

With the above-described configuration, it is possible to maximally enlarge the internal space in which is hermetically sealed the vibrating part of the piezoelectric resonator plate, which leads to use of the vibrating part having maximally enlarged structure. Thus, it is possible to improve the degree of freedom in design of the vibrating part, thereby it is possible to design various vibrating parts with different properties. Also, the space at the four corners of the package can be used as the space for disposing, for example, through holes and electrical paths. Furthermore, in the space at the outer peripheral edge portion of the package, the space other than the space at the four corners can be used as the space for disposing the sealing part. Thus, the space at the outer peripheral edge portion of the package including the space at the four corners can be effectively used. Therefore, the piezoelectric resonator device having the sandwich structure can be easily adapted to reduction in size.

In the above-described configuration, outer through holes may be formed respectively in the four corners of the package so as to penetrate between the first main surface and the second main surface of the piezoelectric resonator plate. Also, in the sealing part, respective outer edge portions along the outer peripheral edge of the package may be formed closer to the outer peripheral edge of the package in plan view than respective straight lines connecting centers of two of the outer through holes are.

With the above-described configuration, the outer through holes are disposed outside the sealing part in plan view. Thus, it is possible to form the outer through holes in the piezoelectric resonator plate using the space at the four corners of the package, accordingly, it is possible to establish conduction between the first main surface and the second main surface of the piezoelectric resonator plate by forming electrodes respectively in the outer through holes. At the four corners of the package, each layer (i.e. the piezoelectric resonator plate, the first sealing member and the second sealing member) easily comes unstuck when an external force is applied. However, in this configuration, the sealing part is disposed so as to be kept away from the four corners of the package, thus it is possible to protect the sealing part from being peeled off by the external force. Also, it is possible to improve hermeticity of the internal space for hermetically sealing the vibrating part of the piezoelectric resonator plate by minimizing the number of the through holes disposed inside the sealing part.

In the above-described configuration, a plurality of wiring patterns may be formed on a first main surface of the first sealing member so as to be electrically connected to an external element. A plurality of external electrode terminals may be formed on a second main surface of the second sealing member so as to be electrically connected to an external circuit board. Outer through electrodes may be respectively formed in the outer through holes so as to establish conduction between electrodes formed on the first main surface and the second main surface of the piezoelectric resonator plate. The wiring patterns and the external electrode terminals may be electrically connected to each other via outer electrical paths including the outer through electrodes.

In the above-described configuration, when the external electrode terminals are electrically connected to the external circuit board using a solder (a flowable conductive bonding material), the solder creeps up from the external electrode terminals to the outer electrical paths. In this case, the hermeticity of the internal space in which is hermetically sealed the vibrating part of the piezoelectric resonator plate may be decreased due to corrosion of the solder that creeps up the outer electrical paths. However, in this configuration, since the outer electrical paths are disposed outside the sealing part, it is possible to prevent the internal space from being affected by corrosion of the solder that decreases the hermeticity.

Here, the external electrode terminals are generally formed on four corner portions of the second main surface of the second sealing member. In this configuration, the outer electrical paths that connect the external electrode terminals to the external element are disposed at the four corners of the package. In this way, it is possible to connect the external electrode terminals to the external element at the shortest distance via the outer electrical paths, and thus, noise can be reduced. Also, since the outer electrical paths are separated from the vibrating part by the sealing part, it is possible to reduce influence of noise caused by higher harmonic components when signals containing higher harmonic components are supplied from the external electrode terminals to the outer electrical paths.

In the above-described configuration, a first through hole may be formed in the first sealing member so as to penetrate between a first main surface and a second main surface of the first sealing member. The first through hole may include a first through electrode that establishes conduction between electrodes formed on the first main surface and the second main surface of the first sealing member, and that is further electrically connected to the first excitation electrode of the piezoelectric resonator plate. A second through hole may be formed in the piezoelectric resonator plate so as to penetrate between the first main surface and the second main surface of the piezoelectric resonator plate. The second through hole may include a second through electrode that establishes conduction between electrodes formed on the first main surface and the second main surface of the piezoelectric resonator plate, and that is further electrically connected to the second excitation electrode of the piezoelectric resonator plate. The first through electrode and the second through electrode may be respectively formed, in plan view, inside the sealing part and furthermore are not needed to be electrically connected to the sealing part.

In the above-described configuration, the outer electrical paths are disposed outside the sealing part while the first through electrode and the second through electrode that connect the external element to the excitation electrodes (the first excitation electrode and the second excitation electrode) are disposed inside the sealing part. Thus, it is possible to reduce increase in parasitic capacity (stray capacity) due to the outer electrical paths. In this case, the outer electrical paths are disposed at the four corners of the package that are separated from the excitation electrodes, which is beneficial to reduction in the parasitic capacity. Also, since the sealing part is not connected to the first through electrode and the second through electrode, it is possible to reduce generation of parasitic capacity due to connection of the sealing part to the first through electrode and the second through electrode, which ensures a large frequency variation amount of the piezoelectric resonator device.

In the above-described configuration, the outer edge of the sealing part may have an octagon shape in plan view.

With the above-described configuration, it is possible to effectively dispose, in the space at the outer peripheral edge portion of the package, the sealing part in the space other than the space at the four corners, and the through holes in the space at the four corners of the package.

Effects of the Invention

With the present invention, it is possible to maximally enlarge the internal space in which is hermetically sealed the vibrating part of the piezoelectric resonator plate, which leads to use of the vibrating part having maximally enlarged structure. Thus, it is possible to improve the degree of freedom in design of the vibrating part, thereby it is possible to design various vibrating parts with different properties. Also, the space at the four corners of the package can be used as the space for disposing the through holes, the electrical paths and the like. Furthermore, in the space at the outer peripheral edge portion of the package, the space other than the space at the four corners can be used as the space for disposing the sealing part. Thus, the space at the outer peripheral edge portion of the package including the space at the four corners can be effectively used. Therefore, the piezoelectric resonator device having the sandwich structure can be easily adapted to reduction in size.

MEANS FOR CARRYING OUT THE INVENTION

Hereinafter, an embodiment of the present invention will be described with reference to the drawings. In the following embodiment, the present invention is applied to a crystal oscillator as a piezoelectric resonator device.

Figure 1:
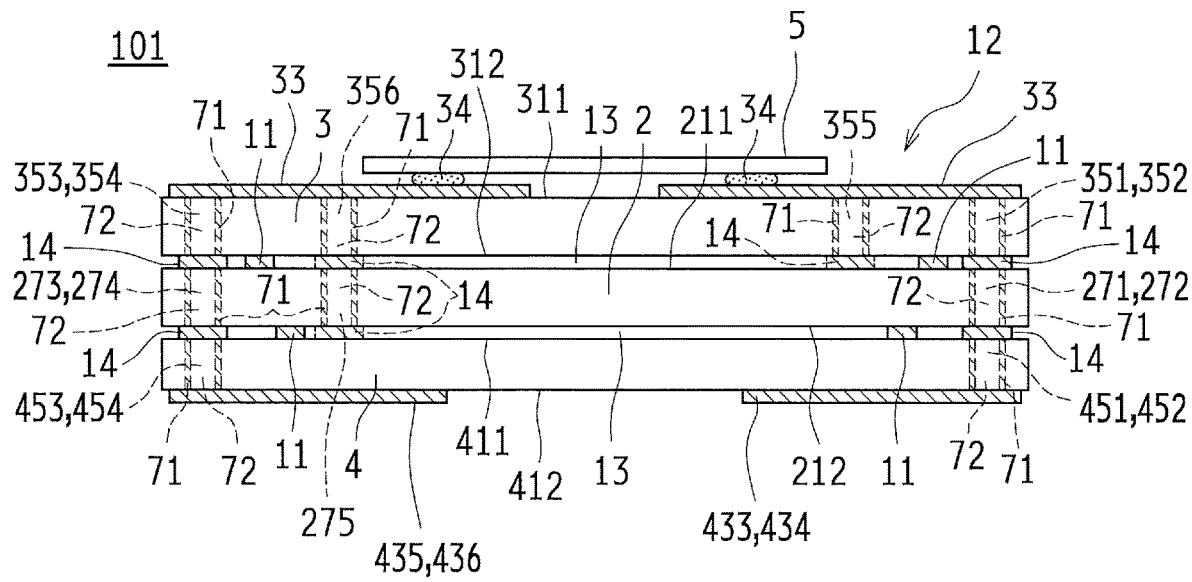
FIG. 1 is a schematic configuration diagram illustrating a configuration of a crystal oscillator according to an embodiment.

As shown in FIG. 1, a crystal oscillator 101 according to this embodiment includes: a crystal resonator plate 2 (a piezoelectric resonator plate in the present invention); a first sealing member 3 that covers a first excitation electrode 221 (see FIG. 4) of the crystal resonator plate 2 so as to hermetically seal the first excitation electrode 221 that is formed on a first main surface 211 of the crystal resonator plate 2; a second sealing member 4 disposed on a second main surface 212 of the crystal resonator plate 2 so as to cover a second excitation electrode 222 (see FIG. 5) of the crystal resonator plate 2, the second sealing member 4 hermetically sealing the second excitation electrode 222 that makes a pair with the first excitation electrode 221; and an electronic component element (an IC 5 in this embodiment) mounted on the first sealing member 3. The IC 5 as the electronic component element is a one-chip integrated circuit element constituting, with the crystal resonator plate 2, an oscillation circuit. In the crystal resonator 101, the crystal resonator plate 2 is bonded to the first sealing member 3, and also the crystal resonator plate 2 is bonded to the second sealing member 4. Thus, a substantially rectangular parallelepiped shaped package 12 having a sandwich structure is constituted.

An internal space 13 of the package 12 is formed by bonding the first sealing member 3 to the second sealing member 4 via the crystal resonator plate 2. In this internal space 13 of the package 12, a vibrating part 23 is hermetically sealed. The vibrating part 23 includes the first excitation electrode 221 and the second excitation electrode 222 respectively formed on both main surfaces 211 and 212 of the crystal resonator plate 2. The crystal oscillator 101 according to this embodiment has, for example, a package size of 1.0×0.8 mm, which is reduced in size and height. According to the size reduction, no castellation is formed in the package 12. Through holes (eleventh through twenty-fifth through holes) are used for conduction between electrodes.

Next, a description will be given on the crystal resonator plate 2, the first sealing member 3 and the second sealing member 4 that constitute the package 12 of the crystal oscillator 101 with reference to FIGS. 1 to 7. Here, each of the crystal resonator plate 2, the first sealing member 3 and the second sealing member 4 will be described as a single body without being bonded.

Figure 4:
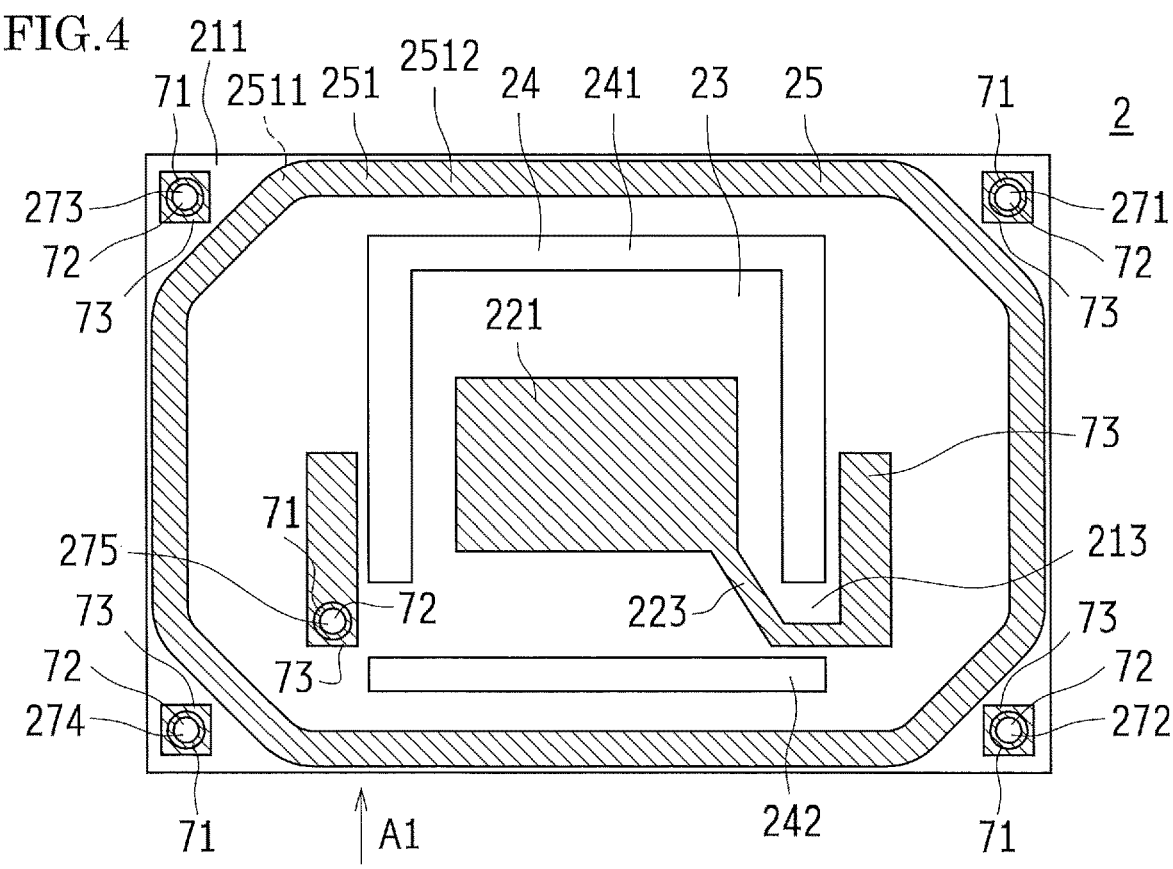
FIG. 4 is a schematic plan view illustrating a crystal resonator plate of the crystal oscillator.
Figure 5:
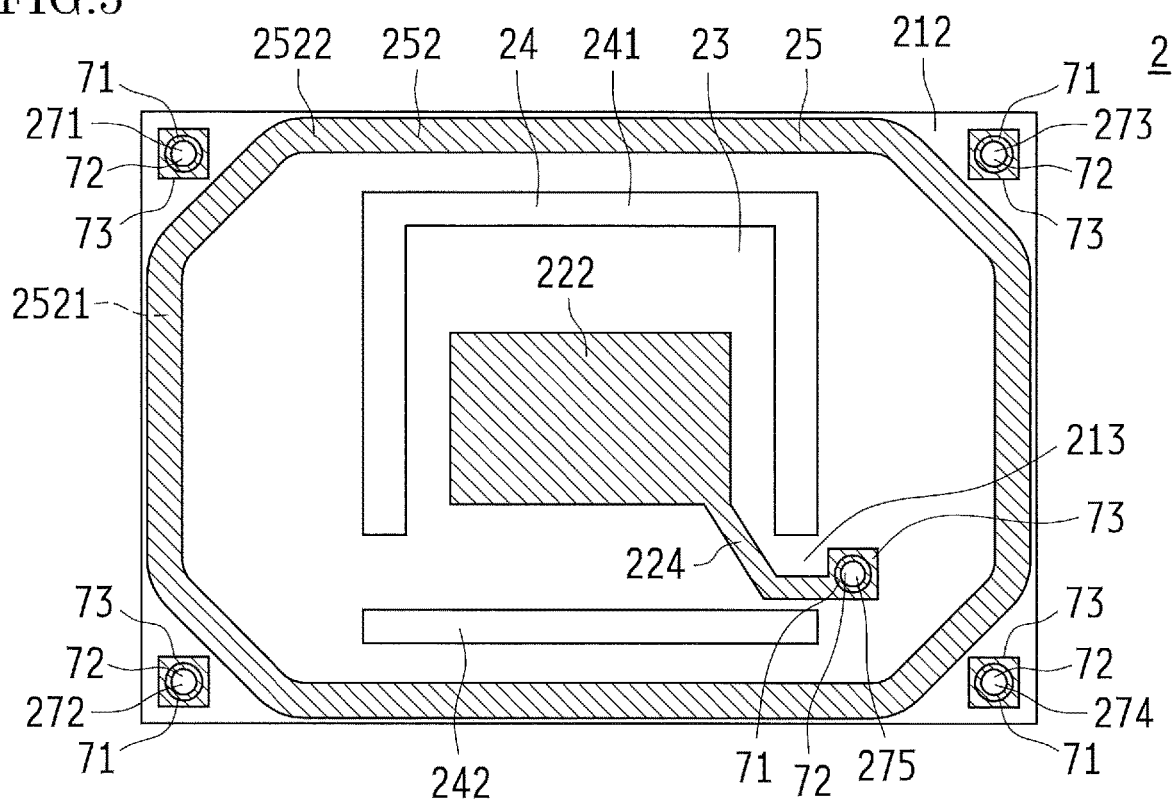
FIG. 5 is a schematic rear view of the crystal resonator plate of the crystal oscillator.

As shown in FIGS. 4 and 5, the crystal resonator plate 2 is made of a crystal as a piezoelectric substrate. Both main surfaces (the first main surface 211 and the second main surface 212) are formed as smooth flat surfaces (mirror-finished).

A pair of excitation electrodes (i.e., excitation electrodes making a pair with each other, that is, the first excitation electrode 221 and the second excitation electrode 222) is formed, respectively, on the main surfaces 211 and 212 (the first main surface 211 and the second main surface 212) of the crystal resonator plate 2. Also, in the main surfaces 211 and 212, two cut-out parts 24 (each having a penetration shape) are formed so as to surround the pair of first excitation electrode 221 and second excitation electrode 222, thus, the vibrating part 23 is formed. The cut-out parts 24 are constituted by a squared U-shaped part 241 in plan view (i.e., a part in plan view made up of three rectangles in plan view: one rectangle; and two rectangles extending from both ends of the one rectangle in the direction perpendicular to the longitudinal direction of the one rectangle), and an oblong rectangular shaped part 242 in plan view. On parts (support parts) 213 between the squared U-shaped part 241 in plan view and the oblong rectangular shaped part 242 in plan view, extraction electrodes (a first extraction electrode 223 and a second extraction electrode 224) are disposed so as to extract the first excitation electrode 221 and the second excitation electrode 222 to the IC 5. The first excitation electrode 221 and the first extraction electrode 223 are constituted by a base PVD film deposited on the first main surface 211 by physical vapor deposition, and an electrode PVD film deposited on the base PVD film by the physical vapor deposition. The second excitation electrode 222 and the second extraction electrode 224 are constituted by a base PVD film deposited on the second main surface 212 by the physical vapor deposition, and an electrode PVD film deposited on the base PVD film by the physical vapor deposition.

In the crystal resonator plate 2, respective resonator-plate-side sealing parts 25 for bonding the first sealing member 3 and the second sealing member 4 are provided on outward positions along the vibrating part 23 of both main surfaces 211 and 212 so as to surround the vibrating part 23. On the resonator-plate-side sealing part 25 on the first main surface 211 of the crystal resonator plate 2, a resonator-plate-side first bonding pattern 251 is formed so as to be bonded to the first sealing member 3. Also, on the resonator-plate-side sealing part 25 on the second main surface 212 of the crystal resonator plate 2, a resonator-plate-side second bonding pattern 252 is formed so as to be bonded to the second sealing member 4. The resonator-plate-side first bonding pattern 251 and the resonator-plate-side second bonding pattern 252 are each formed so as to have an annular shape in plan view, and more specifically, to have a substantially octagon shape as their respective outer edges. The resonator-plate-side first bonding pattern 251 and the resonator-plate-side second bonding pattern 252 are positioned on the crystal resonator plate 2 excluding its four corners in plan view. The resonator-plate-side first bonding pattern 251 and the resonator-plate-side second bonding pattern 252 have the same width and are disposed on the same position in plan view. The internal space 13 is formed in an inward position (inside) of the resonator-plate-side first bonding pattern 251 and the resonator-plate-side second bonding pattern 252 in plan view. Here, the inward position of the internal space 13 means strictly the inner side of respective inner peripheral surfaces of bonding materials 11 (described later), not including the positions on the bonding materials 11. The first excitation electrode 221 and the second excitation electrode 222 of the crystal resonator plate 2 are not electrically connected to the resonator-plate-side first bonding pattern 251 and the resonator-plate-side second bonding pattern 252.

The resonator-plate-side first bonding pattern 251 is constituted by a base PVD film 2511 deposited on the first main surface 211 by the physical vapor deposition, and an electrode PVD film 2512 deposited on the base PVD film 2511 by the physical vapor deposition. The resonator-plate-side second bonding pattern 252 is constituted by a base PVD film 2521 deposited on the second main surface 212 by the physical vapor deposition, and an electrode PVD film 2522 deposited on the base PVD film 2521 by the physical vapor deposition. That is, the resonator-plate-side first bonding pattern 251 and the resonator-plate-side second bonding pattern 252 have the same configuration in which a plurality of layers is laminated on the resonator-plate-side sealing part 25 of both main surfaces 211 and 212, specifically, a Ti layer (or a Cr layer) and an Au layer are deposited by vapor deposition in this order from the lowermost layer side. Like this, in the resonator-plate-side first bonding pattern 251 and the resonator-plate-side second bonding pattern 252, the base PVD films 2511 and 2521 are made of a single material (Ti or Cr), the electrode PVD films 2512 and 2522 are made of a single material (Au), and the electrode PVD films 2512 and 2522 have a thickness greater than the thickness of the base PVD films 2511 and 2521. The first excitation electrode 221 and the resonator-plate-side first bonding pattern 251 both formed on the first main surface 211 of the crystal resonator plate 2 have the same thickness, and the surfaces (main surfaces) of the first excitation electrode 221 and the resonator-plate-side first bonding pattern 251 are made of the same metal. The second excitation electrode 222 and the resonator-plate-side second bonding pattern 252 both formed on the second main surface 212 of the crystal resonator plate 2 have the same thickness, and the surfaces (main surfaces) of the second excitation electrode 222 and the resonator-plate-side second bonding pattern 252 are made of the same metal. The resonator-plate-side first bonding pattern 251 and the resonator-plate-side second bonding pattern 252 do not contain Sn.

Here, the first excitation electrode 221, the first extraction electrode 223 and the resonator-plate-side first bonding pattern 251 can have the same configuration. In this case, it is possible to form collectively the first excitation electrode 221, the first extraction electrode 223 and the resonator-plate-side first bonding pattern 251 by the same process. Similarly to the above, the second excitation electrode 222, the second extraction electrode 224 and the resonator-plate-side second bonding pattern 252 can have the same configuration. In this case, it is possible to form collectively the second excitation electrode 222, the second extraction electrode 224 and the resonator-plate-side second bonding pattern 252 by the same process. More specifically, the base PVD films and the electrode PVD films are formed using a PVD method (for example, a film forming method for patterning in processing such as photolithography) such as vacuum deposition, sputtering, ion plating, molecular beam epitaxy (MBE) and laser ablation. Thus, it is possible to form the films collectively, which leads to reduction in producing processes and in cost.

Also, as shown in FIGS. 4 and 5, five through holes (the eleventh through fifteenth through holes 271 through 275) are formed in the crystal resonator plate 2 so as to penetrate between the first main surface 211 and the second main surface 212. The eleventh through hole 271 is connected to the sixteenth through hole 351 of the first sealing member 3 and to the twenty-second through hole 451 of the second sealing member 4. The twelfth through hole 272 is connected to the seventeenth through hole 352 of the first sealing member 3 and to a twenty-third through hole 452 of the second sealing member 4. The thirteenth through hole 273 is connected to the eighteenth through hole 353 of the first sealing member 3 and to the twenty-fourth through hole 453 of the second sealing member 4. The fourteenth through hole 274 is connected to the nineteenth through hole 354 of the first sealing member 3 and to the twenty-five through hole 454 of the second sealing member 4. The fifteenth through hole 275 is connected to the second extraction electrode 224 extracted from the second excitation electrode 222 and to the twenty-first through hole 356 of the first sealing member 3 via a bonding material 14.

In each of the eleventh through fifteenth through holes 271 through 275, a through electrode 71 is formed along a corresponding inner wall surface of the eleventh through fifteenth through holes 271 through 275 so as to establish conduction between electrodes formed on the first main surface 211 and the second main surface 212, as shown in FIGS. 1, 4 and 5. Each central part of the eleventh through fifteenth through holes 271 through 275 is a hollow through part 72 penetrating between the first main surface 211 and the second main surface 212. A connection bonding pattern 73 is formed on each outer periphery of the eleventh through fifteenth through holes 271 through 275. The respective connection bonding patterns 73 are formed on both main surfaces (the first main surface 211 and the second main surface 212) of the crystal resonator plate 2. The connection bonding patterns 73 have the same configuration as the resonator-plate-side first bonding pattern 251 and the resonator-plate-side second bonding pattern 252, accordingly, they can be formed by the same process as that for the resonator-plate-side first bonding pattern 251 and the resonator-plate-side second bonding pattern 252. Specifically, each connection bonding pattern 73 is constituted by a base PVD film deposited on each main surface (the first main surface 211 and the second main surface 212) of the crystal resonator plate 2 by the physical vapor deposition, and an electrode PVD film deposited on the base PVD film by the physical vapor deposition. The connection bonding pattern 73 of the fifteenth through hole 275 formed on the first main surface 211 of the crystal resonator plate 2 extends along the direction indicated by the arrow A1 in FIG. 4, and is formed between the resonator-plate-side first bonding pattern 251 and the cut-out part 24. The connection bonding pattern 73 of the fifteenth through hole 275 formed on the second main surface 212 of the crystal resonator plate 2 is integrally formed with the second extraction electrode 224 that is extracted from the second excitation electrode 222. Also, the connection bonding pattern 73, which extends along the direction indicated by the arrow A1 in FIG. 4, is integrally formed with the first extraction electrode 223 extracted from the first excitation electrode 221. This connection bonding pattern 73 is formed between the resonator-plate-side first bonding pattern 251 and the cut-out part 24.

In the crystal oscillator 101, the eleventh through fourteenth through holes 271 through 274 are formed in the outward position of the internal space 13 (outside of the respective outer peripheral surfaces of the bonding materials 11) in plan view. More specifically, the eleventh through fourteenth through holes 271 through 274 are formed respectively in the four corners of the crystal resonator plate 2 in plan view. On the other hand, the fifteenth through hole 275 is formed in the inward position of the internal space 13 (inside of the respective inner peripheral surfaces of the bonding materials 11) in plan view. That is, the fifteenth through hole 275 is formed in the crystal resonator plate 2 excluding its four corners in plan view. The eleventh through fifteenth through holes 271 through 275 are not electrically connected to the resonator-plate-side first bonding pattern 251 and the resonator-plate-side second bonding pattern 252.

Figure 2:
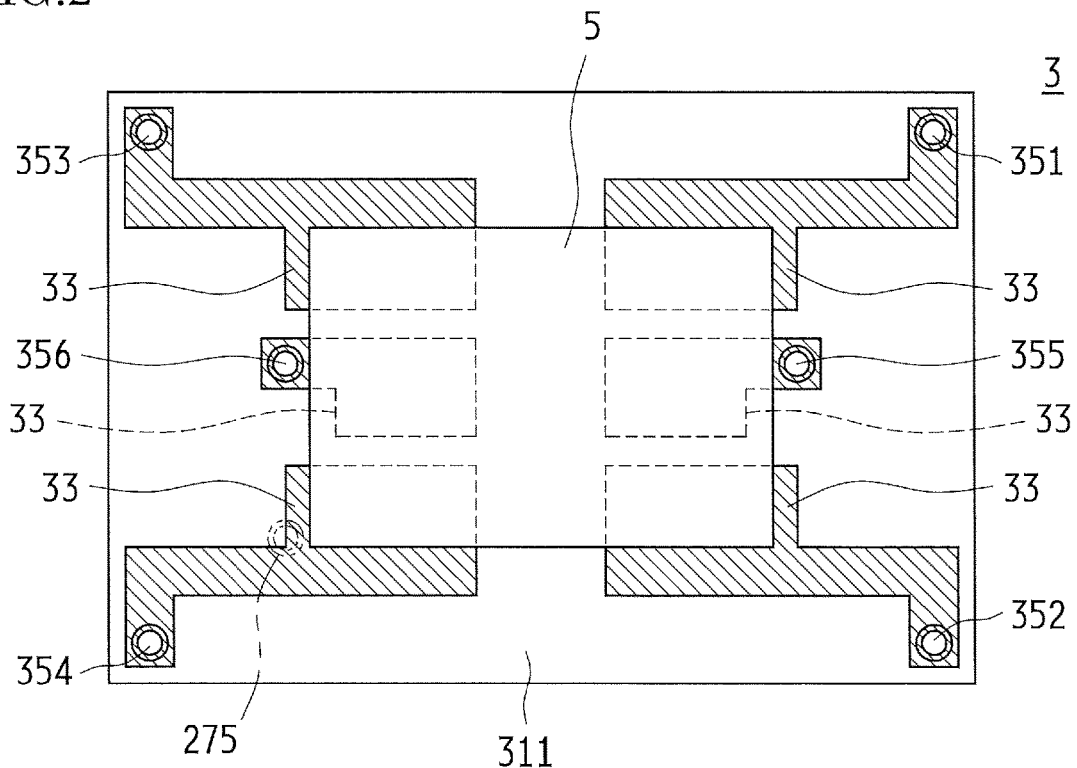
FIG. 2 is a schematic plan view illustrating a first sealing member of the crystal oscillator.
Figure 3:
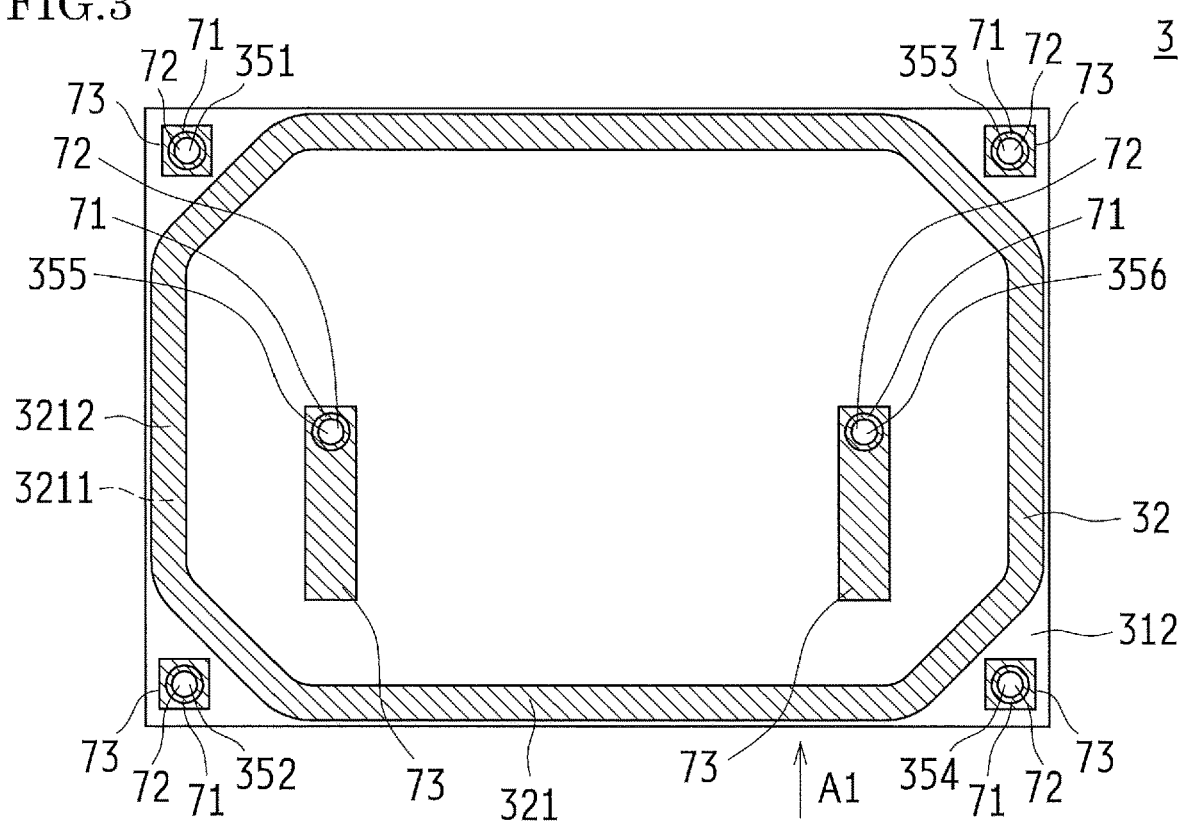
FIG. 3 is a schematic rear view illustrating the first sealing member of the crystal oscillator.

The first sealing member 3 is made of a material having the flexural rigidity (moment of inertia of area×Young's modulus) of not more than 1000 [N·mm$^2$]. Specifically, as shown in FIGS. 2 and 3, the first sealing member 3 is a substrate having a rectangular parallelepiped shape that is made of a single glass wafer. A second main surface 312 (a surface to be bonded to the crystal resonator plate 2) of the first sealing member 3 is formed as a smooth flat surface (mirror finished). The first sealing member 3 has substantially the same shape and size as those of the crystal resonator plate 2 in plan view.

On the second main surface 312 of the first sealing member 3, a sealing-member-side first sealing part 32 is disposed so as to be bonded to the crystal resonator plate 2. On the sealing-member-side first sealing part 32 of the first sealing member 3, a sealing-member-side first bonding pattern 321 is formed so as to be bonded to the crystal resonator plate 2. The sealing-member-side first bonding pattern 321 is formed so as to have an annular shape in plan view, and more specifically, to have a substantially octagon shape as its outer edge. The sealing-member-side first bonding pattern 321 is formed on the first sealing member 3 excluding its four corners in plan view. The sealing-member-side first bonding pattern 321 has the same width at all positions on the sealing-member-side first sealing part 32 of the first sealing member 3.

The sealing-member-side first bonding pattern 321 is constituted by a base PVD film 3211 deposited on the first sealing member 3 by the physical vapor deposition, and an electrode PVD film 3212 deposited on the base PVD film 3211 by the physical vapor deposition. In this embodiment, the base PVD film 3211 is made of Ti (or Cr), and the electrode PVD film 3212 is made of Au. Also, the sealing-member-side first bonding pattern 321 does not contain Sn. Specifically, the sealing-member-side first bonding pattern 321 is made of a plurality of layers laminated on the sealing-member-side first sealing part 32 of the second main surface 312, that is, a Ti layer (or a Cr layer) and an Au layer are deposited by the vapor deposition in this order from the lowermost layer side.

A shown in FIGS. 1 and 2, on a first main surface 311 (the surface on which the IC 5 is mounted) of the first sealing member 3, six electrode patterns 33 are formed, which include mounting pads for mounting the IC 5 as an oscillation circuit element. These six electrode patterns 33 are connected, respectively, to the sixteenth through twenty-first through holes 351 through 356. The IC 5 is bonded to the electrode patterns 33 by the flip chip bonding (FCB) method using a metal bump (for example, Au bump) 34. Each electrode pattern 33 has the same configuration as the configuration of the sealing-member-side first bonding pattern 321, which is constituted by a base PVD film deposited on the first main surface 311 by the physical vapor deposition, and an electrode PVD film deposited on the base PVD film by the physical vapor deposition.

As shown in FIGS. 1 to 3, six through holes (the sixteenth through twenty-first through holes 351 through 356) are formed in the first sealing member 3 so as to penetrate between the first main surface 311 and the second main surface 312. The sixteenth through hole 351 is connected to the eleventh through hole 271 of the crystal resonator plate 2. The seventeenth through hole 352 is connected to the twelfth through hole 272 of the crystal resonator plate 2. The eighteenth through hole 353 is connected to the thirteenth through hole 273 of the crystal resonator plate 2. The nineteenth through hole 354 is connected to the fourteenth through hole 274 of the crystal resonator plate 2. The twentieth through hole 355 is connected to the first extraction electrode 223 extracted from the first excitation electrode 221 of the crystal resonator plate 2 via the bonding material 14. The twenty-first through hole 356 is connected to the fifteenth through hole 275 of the crystal resonator plate 2 via the bonding material 14.

In each of the sixteenth through twenty-first through holes 351 through 356, the through electrode 71 is formed along a corresponding inner wall surface of the sixteenth through twenty-first through holes 351 through 356 so as to establish conduction between electrodes formed on the first main surface 311 and the second main surface 312, as shown in FIGS. 1 to 3. Each central part of the sixteenth through twenty-first through holes 351 through 356 is the hollow through part 72 penetrating between the first main surface 311 and the second main surface 312. The connection bonding pattern 73 is formed on each outer periphery of the sixteenth through twenty-first through holes 351 through 356. The respective connection bonding patterns 73 are formed on the second main surface 312 of the first sealing member 3. The connection bonding patterns 73 have the same configuration as the sealing-member-side first bonding pattern 321, accordingly, they can be formed by the same process as that for the sealing-member-side first bonding pattern 321. That is, each connection bonding pattern 73 is constituted by a base PVD film deposited on the second main surface 312 of the first sealing member 3 by the physical vapor deposition, and an electrode PVD film deposited on the base PVD film by the physical vapor deposition. The respective connection bonding patterns 73 of the twentieth through hole 355 and the twenty-first through hole 356 extend along the direction indicated by the arrow A1 in FIG. 3.

In the crystal oscillator 101, the sixteenth through nineteenth through holes 351 through 354 are formed in the outward position of the internal space 13 (outside of the outer peripheral surface of the bonding material 11) in plan view. More specifically, the sixteenth through nineteenth through holes 351 through 354 are formed respectively in the four corners of the first sealing member 3 in plan view. On the other hand, the twentieth through hole 355 and the twenty-first through hole 356 are formed in the inward position of the internal space 13 (inside of the inner peripheral surface of the bonding material 11) in plan view. That is, the twentieth through hole 355 and the twenty-first through hole 356 are formed in the first sealing member 3 excluding its four corners in plan view. The sixteenth through twenty-first through holes 351 through 356 are not electrically connected to the sealing-member-side first bonding pattern 321. Also, the six electrode patterns 33 are not electrically connected to the sealing-member-side first bonding pattern 321.

Figure 6:
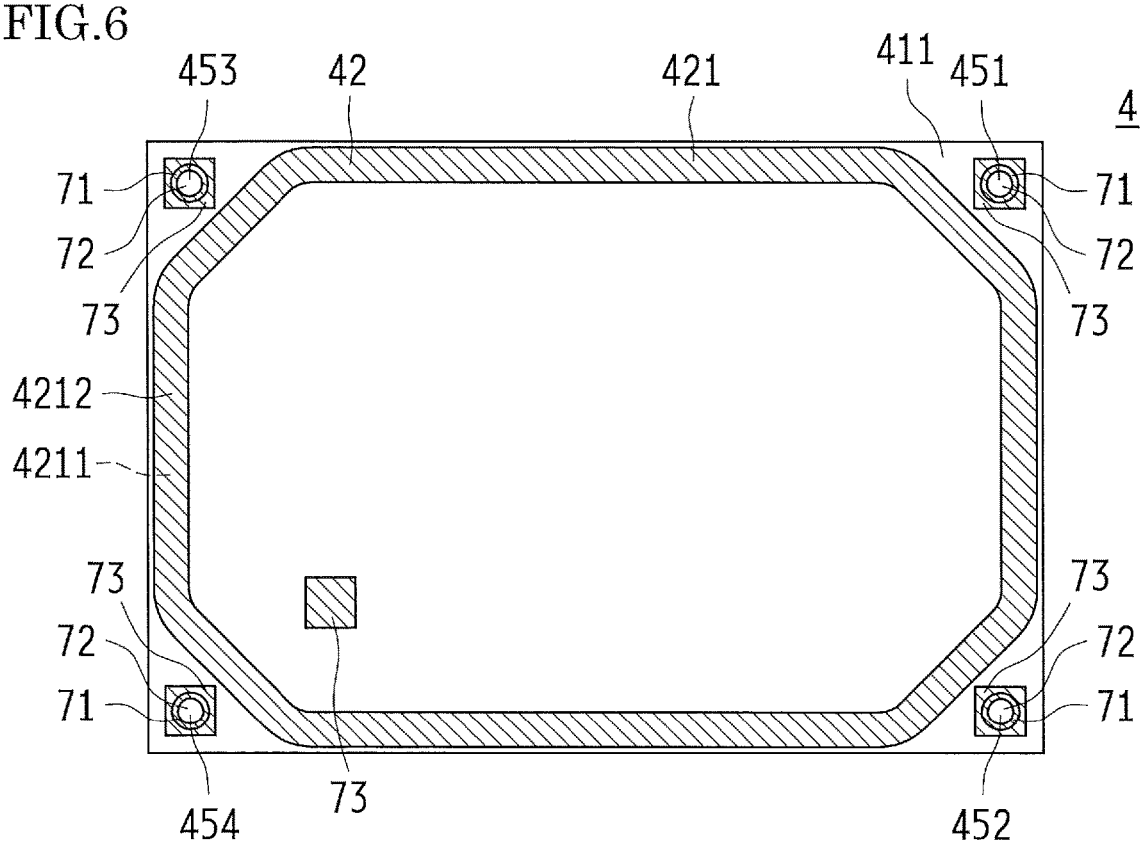
FIG. 6 is a schematic plan view illustrating a second sealing member of the crystal oscillator.

The second sealing member 4 is made of a material having the flexural rigidity (moment of inertia of area× Young's modulus) of not more than 1000 [N·mm$^2$]. Specifically, as shown in FIG. 6, the second sealing member 4 is a substrate having a rectangular parallelepiped shape that is made of a single glass wafer. A first main surface 411 (a surface to be bonded to the crystal resonator plate 2) of the second sealing member 4 is formed as a smooth flat surface (mirror finished). The second sealing member 4 has substantially the same shape and size as those of the crystal resonator plate 2 in plan view.

On the first main surface 411 of the second sealing member 4, a sealing-member-side second sealing part 42 is disposed so as to be bonded to the crystal resonator plate 2. On the sealing-member-side second sealing part 42, a sealing-member-side second bonding pattern 421 is formed so as to be bonded to the crystal resonator plate 2. The sealing-member-side second bonding pattern 421 is formed so as to have an annular shape in plan view, and more specifically, to have a substantially octagon shape as its outer edge. The sealing-member-side second bonding pattern 421 is formed on the second sealing member 4 excluding its four corners in plan view. The sealing-member-side second bonding pattern 421 has the same width at all positions on the sealing-member-side second sealing part 42 of the second sealing member 4.

The sealing-member-side second bonding pattern 421 is constituted by a base PVD film 4211 deposited on the second sealing member 4 by the physical vapor deposition, and an electrode PVD film 4212 deposited on the base PVD film 4211 by the physical vapor deposition. In this embodiment, the base PVD film 4211 is made of Ti (or Cr), and the electrode PVD film 4212 is made of Au. Also, the sealing-member-side second bonding pattern 421 does not contain Sn. Specifically, the sealing-member-side second bonding pattern 421 is made of a plurality of layers laminated on the sealing-member-side second sealing part 42 of the first main surface 411, that is, a Ti layer (or a Cr layer) and an Au layer are deposited by the vapor deposition in this order from the lowermost layer side.

Four external electrode terminals (first through fourth external electrode terminals 433 through 436), which are electrically connected to the outside, are formed on a second main surface 412 (the outer main surface not facing the crystal resonator plate 2) of the second sealing member 4. The first through fourth external electrode terminals 433 through 436 are respectively located at the four corner portions of the second main surface 412 of the second sealing member 4. These external electrode terminals (the first through fourth external electrode terminals 433 through 436) are respectively constituted by base PVD films 4331 to 4361 deposited on the second main surface 412 by the physical vapor deposition, and electrode PVD films 4332 to 4362 respectively deposited on the base PVD films 4331 to 4361 by the physical vapor deposition.

Figure 7:
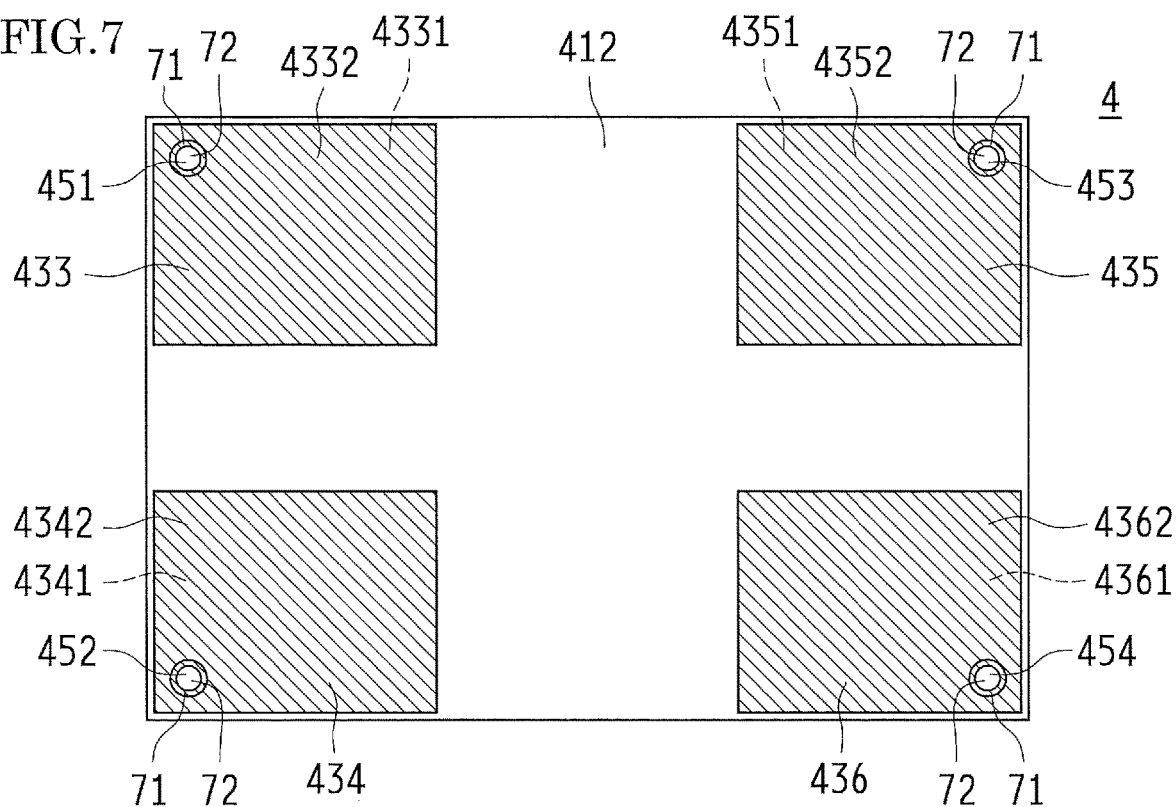
FIG. 7 is a schematic rear view illustrating the second sealing member of the crystal oscillator.

As shown in FIGS. 1, 6 and 7, four through holes (the twenty-second through twenty-fifth through holes 451 through 454) are formed in the second sealing member 4 so as to penetrate between the first main surface 411 and the second main surface 412. The twenty-second through hole 451 is connected to the first external electrode terminal 433 and to the eleventh through hole 271 of the crystal resonator plate 2. The twenty-third through hole 452 is connected to the second external electrode terminal 434 and to the twelfth through hole 272 of the crystal resonator plate 2. The twenty-fourth through hole 453 is connected to the third external electrode terminal 435 and to the thirteenth through hole 273 of the crystal resonator plate 2. The twenty-fifth through hole 454 is connected to the fourth external electrode terminal 436 and to the fourteenth through hole 274 of the crystal resonator plate 2.

In each of the twenty-second through twenty-fifth through holes 451 through 454, the through electrode 71 is formed along a corresponding inner wall surface of the twenty-second through twenty-fifth through holes 451 through 454 so as to establish conduction between electrodes formed on the first main surface 411 and the second main surface 412, as shown in FIGS. 1, 6 and 7. Each central part of the twenty-second through twenty-fifth through holes 451 through 454 is the hollow through part 72 penetrating between the first main surface 411 and the second main surface 412. The connection bonding pattern 73 is formed on each outer periphery of the twenty-second through twenty-fifth through holes 451 through 454. The connection bonding patterns 73 are formed on the first main surface 411 of the second sealing member 4. The connection bonding patterns 73 have the same configuration as the sealing-member-side second bonding pattern 421, accordingly, they can be formed by the same process as that for the sealing-member-side second bonding pattern 421. Specifically, the connection bonding patterns 73 are each constituted by a base PVD film deposited on the first main surface 411 of the second sealing member 4 by the physical vapor deposition, and an electrode PVD film deposited on the base PVD film by the physical vapor deposition.

In the crystal oscillator 101, the twenty-second through twenty-fifth through holes 451 through 454 are formed in the outward position of the internal space 13 (outside of the respective outer peripheral surfaces of the bonding materials 11) in plan view. More specifically, the twenty-second through twenty-fifth through holes 451 through 454 are formed respectively in the four corners of the second sealing member 4 in plan view. The twenty-second through twenty-fifth through holes 451 through 454 are not electrically connected to the sealing-member-side second bonding pattern 421. Also, the first through fourth external electrode terminals 433 through 436 are not electrically connected to the sealing-member-side second bonding pattern 421.

In the above-described crystal oscillator 101 including the crystal resonator plate 2, the first sealing member 3 and the second sealing member 4, there is no need to use any special bonding material such as an adhesive. That is, the crystal resonator plate 2 and the first sealing member 3 are subjected to the diffusion bonding in a state in which the resonator-plate-side first bonding pattern 251 and the sealing-member-side first bonding pattern 321 are overlapped with each other, and the crystal resonator plate 2 and the second sealing member 4 are subjected to the diffusion bonding in a state in which the resonator-plate-side second bonding pattern 252 and the sealing-member-side second bonding pattern 421 are overlapped with each other, thus, the package 12 having the sandwich structure as shown in FIG. 1 is produced. In this way, the internal space 13 of the package 12, i.e. the space for housing the vibrating part 23 is hermetically sealed. The resonator-plate-side first bonding pattern 251 and the sealing-member-side first bonding pattern 321 themselves become the bonding material 11 formed upon the diffusion bonding. The resonator-plate-side second bonding pattern 252 and the sealing-member-side second bonding pattern 421 themselves become the bonding material 11 formed upon the diffusion bonding. The respective bonding materials 11 are formed so as to have an annular shape in plan view, and to have a substantially octagon shape as their respective outer edges.

At this time, the respective connection bonding patterns 73 on the outer peripheries of the eleventh through twenty-fifth through holes are also subjected to the diffusion bonding in a state in which they are overlapped with each other. Specifically, the respective connection bonding patterns 73 of the eleventh through hole 271 and the sixteenth through hole 351 are subjected to the diffusion bonding. The respective connection bonding patterns 73 of the eleventh through hole 271 and the twenty-second through hole 451 are subjected to the diffusion bonding. The respective connection bonding patterns 73 of the twelfth through hole 272 and the seventeenth through hole 352 are subjected to the diffusion bonding. The respective connection bonding patterns 73 of the twelfth through hole 272 and the twenty-third through hole 452 are subjected to the diffusion bonding. The respective connection bonding patterns 73 of the thirteenth through hole 273 and the eighteenth through hole 353 are subjected to the diffusion bonding. The respective connection bonding patterns 73 of the thirteenth through hole 273 and the twenty-fourth through hole 453 are subjected to the diffusion bonding. The respective connection bonding patterns 73 of the fourteenth through hole 274 and the nineteenth through hole 354 are subjected to the diffusion bonding. The respective connection bonding patterns 73 of the fourteenth through hole 274 and the twenty-fifth through hole 454 are subjected to the diffusion bonding.

The respective connection bonding patterns 73 of the fifteenth through hole 275 and the twenty-first through hole 356 are subjected to the diffusion bonding. The connection bonding pattern 73 of the fifteenth through hole 275 is overlapped with the connection bonding pattern 73 formed on the first main surface 411 of the second sealing member 4 so as to be subjected to the diffusion bonding. The connection bonding pattern 73 of the twentieth through hole 355 is overlapped with the connection bonding pattern 73 extending from the first extraction electrode 223 extracted from the first excitation electrode 221 of the crystal resonator plate 2 so as to be subjected to the diffusion bonding. Then, the respective connection bonding patterns 73 themselves become the bonding materials 14 formed upon the diffusion bonding. The bonding materials 14 formed upon the diffusion bonding serve to establish conduction between the through electrodes 71 of the through holes and to hermetically seal the bonding parts. In FIG. 1, the bonding materials 14 formed outside the bonding material 11 for sealing in plan view are shown by the solid line, while the bonding materials 14 formed inside the bonding materials 11 are shown by the broken line.

Thus, the twentieth through hole 355 serves as a first electrical path (conduction path) to conduct the IC 5 to the first excitation electrode 221. The twenty-first through hole 356 and the fifteenth through hole 275 serve as a second electrical path to conduct the IC 5 to the second excitation electrode 222. Also, the sixteenth through hole 351, the eleventh through hole 271 and the twenty-second through hole 451 serve as a third electrical path to conduct the IC 5 to the first external electrode terminal 433. The seventeenth through hole 352, the twelfth through hole 272 and the twenty-third through hole 452 serve as a fourth electrical path to conduct the IC 5 to the second external electrode terminal 434. The eighteenth through hole 353, the thirteenth through hole 273 and the twenty-fourth through hole 453 serve as a fifth electrical path to conduct the IC 5 to the third external electrode terminal 435. The nineteenth through hole 354, the fourteenth through hole 274 and the twenty-fifth through hole 454 serve as a sixth electrical path to conduct the IC 5 to the fourth external electrode terminal 436.

In this embodiment, the diffusion bonding is performed at a room temperature. Here, the room temperature means the temperature in the range from 5 to 35° C. Advantageous effects as described later (suppression of generation of gas and improvement of bonding) are obtained by the diffusion bonding at the room temperature, which is lower than the melting point of 183° C. of the eutectic solder. Thus, this is a preferable embodiment. However, the advantageous effects described later can be obtained by the diffusion bonding performed at temperatures other than the room temperature. That is, the diffusion bonding may be performed at the temperature in the range from the room temperature to the temperature less than 230° C. In particular, when the diffusion bonding is performed at the temperature in the range from 200° C. to less than 230° C., which is less than the melting point of 230° C. of the Pb-free solder and furthermore not less than the recrystallization temperature (200° C.) of Au, it is possible to stabilize unstable regions of the bonding parts. Also, in this embodiment, since the special bonding material such as Au—Sn is not used, the gas such as plating gas, binder gas or metal gas is not generated. Thus, the temperature can be equal to or more than the recrystallization temperature of Au.

In the package 12 produced by the diffusion bonding, the first sealing member 3 and the crystal resonator plate 2 have a gap of not more than 1.00 µm. The second sealing member 4 and the crystal resonator plate 2 have a gap of not more than 1.00 µm. That is, the thickness of the bonding material 11 between the first sealing member 3 and the crystal resonator plate 2 is not more than 1.00 µm, and the thickness of the bonding material 11 between the second sealing member 4 and the crystal resonator plate 2 is not more than 1.00 µm (specifically, the thickness in the Au—Au bonding of this embodiment is 0.15 to 1.00 µm). As a comparative example, the conventional metal paste sealing material containing Sn has a thickness of 5 to 20 µm.

The first excitation electrode 221, the second excitation electrode 222 and the first through fourth external electrode terminals 433 through 436 in the crystal oscillator 101 are not electrically connected to the bonding materials 11 (i.e. the resonator-plate-side first bonding pattern 251 and the sealing-member-side first bonding pattern 321, and the resonator-plate-side second bonding pattern 252 and the sealing-member-side second bonding pattern 421) as the sealing parts for hermetically sealing the vibrating part 23. More specifically, the first excitation electrode 221 is electrically connected to the IC 5 via the first electrical path (the twentieth through hole 355) and the electrode pattern 33 in this order. The second excitation electrode 222 is electrically connected to the IC 5 via the second electrical path (the fifteenth through hole 275 and the twenty-first through hole 356) and the electrode pattern 33 in this order. The first electrical path and the second electrical path are inner electrical paths that are disposed inside the bonding materials 11 in plan view. The fifteenth through hole 275 and the twenty-first through hole 356 that constitute the second electrical path are provided so as to be superimposed to each other in plan view.

The IC 5 is electrically connected to the first external electrode terminal 433 via the electrode pattern 33 and the third electrical path (the sixteenth through hole 351, the eleventh through hole 271 and the twenty-second through hole 451) in this order. The IC 5 is electrically connected to the second external electrode terminal 434 via the electrode pattern 33 and the fourth electrical path (the seventeenth through hole 352, the twelfth through hole 272 and the twenty-third through hole 452) in this order. The IC 5 is electrically connected to the third external electrode terminal 435 via the electrode pattern 33 and the fifth electrical path (the eighteenth through hole 353, the thirteenth through hole 273 and the twenty-fourth through hole 453) in this order. The IC 5 is electrically connected to the fourth external electrode terminal 436 via the electrode pattern 33 and the sixth electrical path (the nineteenth through hole 354, the fourteenth through hole 274 and the twenty-fifth through hole 454) in this order. The third through sixth electrical paths are outer electrical paths that are disposed outside the bonding materials 11 in plan view.

The sixteenth through hole 351, the eleventh through hole 271 and the twenty-second through hole 451, which constitute the third electrical path, are provided so as to be superimposed to each other in plan view. The seventeenth through hole 352, the twelfth through hole 272 and the twenty-third through hole 452, which constitute the fourth electrical path, are provided so as to be superimposed to each other in plan view. The eighteenth through hole 353, the thirteenth through hole 273 and the twenty-fourth through hole 453, which constitute the fifth electrical path, are provided so as to be superimposed to each other in plan view. The nineteenth through hole 354, the fourteenth through hole 274 and the twenty-fifth through hole 454, which constitute the sixth electrical path, are provided so as to be superimposed to each other in plan view. Thus, it is possible to ensure a large area for performing the FCB method when mounting the IC 5 on the first main surface 311 of the first sealing member 3 by the FCB method.

Figure 8:
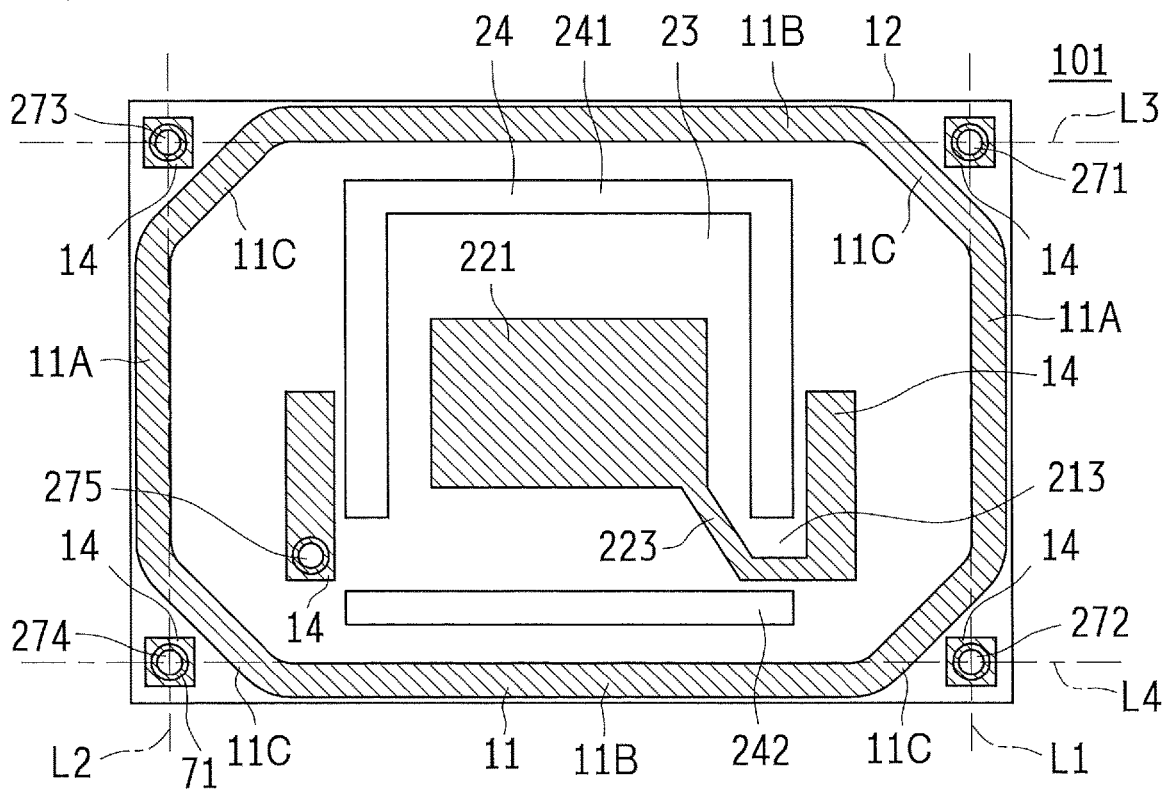
FIG. 8 is a diagram illustrating a positional relationship in plan view between a bonding material, and a vibrating part and through holes of the crystal resonator plate in the crystal oscillator.

In the crystal oscillator 101 of this embodiment, the bonding materials 11 as the sealing parts are disposed along the outer peripheral edge of the package 12 excluding the four corners of the package 12 in plan view. Hereinafter, the above configuration will be described with reference to FIGS. 1 to 8. FIG. 8 is a diagram illustrating a positional relationship in plan view between the bonding material 11, and the vibrating part 23 and the through holes of the crystal resonator plate 2 in the crystal oscillator 101. In FIG. 8, the eleventh through fifteenth through holes 271 through 275 of the crystal resonator plate 2 are shown as the examples of the through holes. In this embodiment, the outer peripheral edge of the package 12 coincide with the respective outer peripheral edges of the crystal resonator plate 2, the first sealing member 3 and the second sealing member 4 in plan view.

In the crystal oscillator 101, the bonding material 11 between the crystal resonator plate 2 and the first sealing member 3 is formed by the diffusion bonding of the resonator-plate-side first bonding pattern 251 to the sealing-member-side first bonding pattern 321. Also, the bonding material 11 between the crystal resonator plate 2 and the second sealing member 4 is formed by the diffusion bonding of the resonator-plate-side second bonding pattern 252 to the sealing-member-side second bonding pattern 421.

The resonator-plate-side first bonding pattern 251, the resonator-plate-side second bonding pattern 252, the sealing-member-side first bonding pattern 321 and the sealing-member-side second bonding pattern 421 have the same shape and size in plan view. Accordingly, the bonding material 11 between the crystal resonator plate 2 and the first sealing member 3 has the same shape and size as those of the bonding material 11 between the crystal resonator plate 2 and the second sealing member 4 in plan view. Thus, the crystal oscillator 101 includes the respective bonding materials 11 having the same shape and size in plan view on both main surfaces 211 and 212 of the crystal resonator plate 2.

The outer edge of the bonding material 11 has an octagon shape in plan view. The outer edge of the bonding material 11 has the same shape as that of the respective outer edges of the resonator-plate-side first bonding pattern 251, the resonator-plate-side second bonding pattern 252, the sealing-member-side first bonding pattern 321 and the sealing-member-side second bonding pattern 421 (see FIGS. 3 to 6).

In the crystal oscillator 101, the bonding materials 11 are disposed along (in parallel with) the outer peripheral edge of the package 12 excluding the four corners of the package 12 in plan view. The bonding materials 11 are arranged so as to be kept away from the third through sixth electrical paths at the four corners of the package 12 (i.e. the eleventh through fourteenth through holes 271 through 274, the sixteenth through nineteenth through holes 351 through 354 and the twenty-second through twenty-fifth through holes 451 through 454). Also, the bonding materials 11 are disposed so as to surround the vibrating part 23 in plan view, thus, the space for housing the vibrating part 23 (the internal space 13) is hermetically sealed by the bonding materials 11.

Specifically, as shown in FIG. 8 in plan view, the bonding material 11 is constituted by: a pair of first linear portions 11A disposed along (in parallel with) a pair of short sides of the package 12; a pair of second linear portions 11B disposed along (in parallel with) a pair of long sides of the package 12; and four connecting portions 11C disposed so as to connect end parts of the first linear portions 11A to end parts of the second linear portions 11B. The pair of first linear portions 11A and the pair of second linear portions 11B are outer edge portions along the outer peripheral edge (i.e. the short sides and the long sides) of the package 12.

The pair of first linear portions 11A is disposed, in plan view, adjacent to the respective short sides of the package 12. The length of the first linear portions 11A (size in the short side direction) is at least not less than ⅓ of the short side of the package 12. The two first linear portions 11A have the same length. The eleventh through hole 271 and the twelfth through hole 272 are disposed spaced apart from the respective ends of one first linear portion 11A in the short side direction at a predetermined interval. The outer edge of the one first linear portion 11A is arranged, in plan view, closer to the corresponding short side of the package 12 than a straight line L1 connecting the centers of the eleventh through hole 271 and the twelfth through hole 272 is. The thirteenth through hole 273 and the fourteenth through hole 274 are disposed spaced apart from the respective ends of the other first linear portion 11A in the short side direction at a predetermined interval. The outer edge of the other first linear portion 11A is arranged, in plan view, closer to the corresponding short side of the package 12 than a straight line L2 connecting the centers of the thirteenth through hole 273 and the fourteenth through hole 274 is. In this embodiment, each outer edge of the first linear portions 11A is disposed spaced apart from the corresponding short side of the package 12 at a predetermined interval. Also, the inner edge of the one first linear portion 11A is positioned, in plan view, on the straight line L1 while the inner edge of the other first linear portion 11A is positioned, in plan view, on the straight line L2. Note that the inner edge of the one first linear portion 11A may be positioned outside/inside the straight line L1 provided that the outer edge of the one first linear portion 11A is positioned closer to the corresponding short side of the package 12 than the straight line L1 is. Likewise, the inner edge of the other first linear portion 11A may be positioned outside/inside the straight line L2 provided that the outer edge of the other first linear portion 11A is positioned closer to the corresponding short side of the package 12 than the straight line L2 is.

The pair of second linear portions 11B is disposed, in plan view, adjacent to the respective long sides of the package 12. The length of the second linear portions 11B (size in the long side direction) is at least not less than ⅓ of the long side of the package 12, which is longer than the above first linear portion 11A. The two second linear portions 11B have the same length. The eleventh through hole 271 and the thirteenth through hole 273 are disposed spaced apart from the respective ends of one second linear portions 11B in the long side direction at a predetermined interval. The outer edge of the one second linear portion 11B is arranged, in plan view, closer to the corresponding long side of the package 12 than a straight line L3 connecting the centers of the eleventh through hole 271 and the thirteenth through hole 273 is. The twelfth through hole 272 and the fourteenth through hole 274 are disposed spaced apart from the respective ends of the other second linear portions 11B in the long side direction at a predetermined interval. The outer edge of the other second linear portion 11B is arranged, in plan view, closer to the corresponding long side of the package 12 than a straight line L4 connecting the centers of the twelfth through hole 272 and the fourteenth through hole 274 is. In this embodiment, each outer edge of the second linear portions 11B is disposed spaced apart from the corresponding long side of the package 12 at a predetermined interval. Also, the inner edge of the one second linear portion 11B is positioned, in plan view, on the straight line L3 while the inner edge of the other second linear portion 11B is positioned, in plan view, on the straight line L4. Note that the inner edge of the one second linear portion 11B may be positioned outside/inside the straight line L3 provided that the outer edge of the one second linear portion 11B is positioned closer to the corresponding long side of the package 12 than the straight line L3 is. Likewise, the inner edge of the other first linear portion 11B may be positioned outside/inside the straight line L4 provided that the outer edge of the other second linear portion 11B is positioned closer to the corresponding long side of the package 12 than the straight line L4 is.

The four connecting portions 11C are not in parallel with the outer peripheral edge (i.e. the short sides and the long sides) of the package 12 in plan view. In this embodiment, the connecting portions 11C extend substantially in parallel with either of the two diagonals of the package 12. That is, each connecting portion 11C is disposed so as to intersect with the corresponding diagonal of the package 12 in plan view. Also, each connecting portion 11C may be disposed so as to be perpendicular to the corresponding diagonal of the package 12 in plan view.

The length of the connecting portions 11C is shorter than the length of the above-described first linear portions 11A and the length of the above-described second linear portions 11B. The four connecting portions 11C have the same length. The connecting portions 11C are disposed respectively on the four corners of the package 12, which are adjacent, respectively, to the eleventh through fourteenth through holes 271 through 274. The connecting portions 11C are disposed spaced apart from the respective bonding materials 14 (connection bonding patterns 73) of the outer peripheries of the eleventh through fourteenth through holes 271 through 274.

As described above, in this embodiment, the bonding materials 11 are disposed along the outer peripheral edge of the package 12 excluding the four corners of the package 12 in plan view, and the through holes (the eleventh through fourteenth through holes 271 through 274, the sixteenth through nineteenth through holes 351 through 354 and the twenty-second through twenty-fifth through holes 451 through 454) are disposed outside the bonding materials 11 in plan view. With this configuration, the following effects can be obtained.

It is possible to maximally enlarge the internal space 13 in which is hermetically sealed the vibrating part 23 of the crystal resonator plate 2, which leads to use of the vibrating part 23 having maximally enlarged structure. Thus, it is possible to improve the degree of freedom in design of the vibrating part 23, thereby it is possible to design various vibrating parts 23 with different properties. Also, the space at the four corners of the package 12 can be used as the space for disposing the eleventh through fourteenth through holes 271 through 274, the sixteenth through nineteenth through holes 351 through 354 and the twenty-second through twenty-fifth through holes 451 through 454. Furthermore, in the space at the outer peripheral edge portion of the package 12, the space other than the space at the four corners can be used as the space for disposing the bonding materials 11. Thus, the space at the outer peripheral edge portion of the package 12 including the space at the four corners can be effectively used. Therefore, the crystal oscillator 101 having the sandwich structure can be easily adapted to reduction in size. Besides, each bonding material 11 is formed so as to have an octagon shape as its outer edge in plan view, it is possible to more efficiently dispose the respective bonding materials 11, the eleventh through fourteenth through holes 271 through 274, the sixteenth through nineteenth through holes 351 through 354 and the twenty-second through twenty-fifth through holes 451 through 454.

At the four corners of the package 12, each layer (i.e. the crystal resonator plate 2, the first sealing member 3 and the second sealing member 4) easily comes unstuck when an external force is applied. However, in this embodiment, the eleventh through fourteenth through holes 271 through 274, the sixteenth through nineteenth through holes 351 through 354 and the twenty-second through twenty-fifth through holes 451 through 454 are respectively disposed in the four corners of the package 12 while the respective bonding materials 11 are disposed on the package 12 so as to be kept away from the four corners. Therefore, it is possible to protect the bonding materials 11 from being peeled off by the external force. Here, the outer edge of each bonding material 11 has an octagon shape and the connecting portions 11C are disposed so as to intersect with the diagonals of the package 12. Thus, the connecting portions 11C can relax a stress transmitted from the four corners toward the center of the package 12, which results in the bonding materials 11 protected from being peeled off by the external force.

In each bonding material 11, the first linear portions 11A and the second linear portions 11B along the outer peripheral edge of the package 12 are arranged, in plan view, closer to the outer peripheral edge of the package 12 than the straight lines L1 to L4 connecting respectively the centers of the two through holes are. Furthermore, each bonding material 11 is disposed so as to be kept away from the four corners of the package 12 in which are disposed the eleventh through fourteenth through holes 271 through 274, the sixteenth through nineteenth through holes 351 through 354 and the twenty-second through twenty-fifth through holes 451 through 454. That is, the eleventh through fourteenth through holes 271 through 274, the sixteenth through nineteenth through holes 351 through 354 and the twenty-second through twenty-fifth through holes 451 through 454 are disposed outside the bonding material 11. In this way, it is possible to improve the hermeticity of the internal space 13 in which is hermetically sealed the vibrating part 23 of the crystal resonator plate 2 by minimizing the number of the through holes disposed inside the bonding materials 11.

Also, when bonding the crystal oscillator 101 to an external circuit board using a solder (a flowable conductive bonding material), the solder creeps up the through parts 72 of the twenty-second through twenty-fifth through holes 451 through 454 along the twenty-second through twenty-fifth through holes 451 through 454 from the external electrode terminals (the first through fourth external electrode terminals 433 through 436), thus the through parts 72 of the twenty-second through twenty-fifth through holes 451 through 454 are filled with the solder. In this case, the hermeticity of the internal space 13 in which is hermetically sealed the vibrating part 23 of the crystal resonator plate 2 may be decreased due to corrosion of the solder that creeps up the through parts 72. However, in this embodiment, since the eleventh through fourteenth through holes 271 through 274, the sixteenth through nineteenth through holes 351 through 354 and the twenty-second through twenty-fifth through holes 451 through 454 are disposed outside the bonding materials 11, it is possible to prevent the internal space 13 from being affected by corrosion of the solder that decreases the hermeticity.

Here, the external electrode terminals (the first through fourth external electrode terminals 433 through 436) are generally formed on four corner portions of the second main surface 412 of the second sealing member 4. That is, the third through sixth electrical paths (i.e. the eleventh through fourteenth through holes 271 through 274, the sixteenth through nineteenth through holes 351 through 354 and the twenty-second through twenty-fifth through holes 451 through 454), which connect the external electrode terminals to the IC 5, are disposed at the four corners of the package 12. In this way, it is possible to connect the external electrode terminals to the IC 5 at the shortest distance via the third through sixth electrical paths, and thus, noise can be reduced. Also, since the third through sixth electrical paths are separated from the vibrating part 23 by the bonding materials 11, it is possible to reduce influence of noise caused by higher harmonic components when signals containing higher harmonic components are supplied from the external electrode terminals to the third through sixth electrical paths.

Also, the third through sixth electrical paths are disposed outside the bonding materials 11 while the first and second electrical paths that connect the IC 5 to the excitation electrodes (the first excitation electrode 221 and the second excitation electrode 222) are disposed inside the bonding materials 11. Thus, it is possible to reduce increase in parasitic capacity (stray capacity) due to the third through sixth electrical paths. In this case, the third through sixth electrical paths are disposed at the four corners of the package 12 that are spaced apart from the excitation electrodes, which is beneficial to reduction in the parasitic capacity. Also, since the bonding materials 11 are not connected to the first and second electrical paths, it is possible to reduce generation of parasitic capacity due to connection of the bonding materials 11 to the first and second electrical paths, which ensures a large frequency variation amount of the piezoelectric resonator device.

The present invention can be embodied in other forms without departing from the spirit, scope or essential characteristics thereof. The foregoing embodiments are therefore to be considered as illustrative and not restrictive. The scope of the present invention is indicated by the appended claims rather than by the foregoing description. Furthermore, all modifications and changes that come within the meaning and range of equivalency of the claims are intended to be embraced therein.

In this embodiment, the first sealing member 3 and the second sealing member 4 are made of glass, however, the present invention is not limited thereto. They may be made of crystal. Also, the crystal resonator plate 2, the first sealing member 3 and the second sealing member 4 may be made of AT-cut crystal. In this case, since the crystal resonator plate 2, the first sealing member 3 and the second sealing member 4 have the same coefficient of thermal expansion, it is possible to prevent deformation of package 12 caused by difference in the coefficient of thermal expansion among the crystal resonator plate 2, the first sealing member 3 and the second sealing member 4. Thus, it is possible to improve the hermeticity of the internal space 13 in which is hermetically sealed the vibrating part 23 of the crystal resonator plate 2. Also, distortion of the package 12 due to the deformation is transmitted to the first excitation electrode 221 and the second excitation electrode 222 via the support part 213, which may cause frequency variations. However, it is possible to reduce such frequency variations by using the crystal resonator plate 2, the first sealing member 3 and the second sealing member 4, all of which are made of crystal.

Also, in this embodiment, the piezoelectric resonator plate is made of crystal, however, the present invention is not limited thereto. It may be made of another material such as lithium niobate and lithium tantalate, i.e., a piezoelectric material.

Also, in this embodiment, the bonding materials 11 are made of Ti (or Cr) and Au, however, the present invention is not limited thereto. The bonding materials 11 may be made, for example, of Ni and Au.

Also, in this embodiment, the outer edge of the bonding materials 11 has an octagon shape, however, the present invention is not limited thereto. The outer edge of the bonding materials 11 may have any polygon shape having five sides or more such as a pentagon or a hexagon. Furthermore, the outer edge of the bonding materials 11 is not limited to the polygon shape. It may be a shape including a curved portion. Specifically, the above-described connecting portions 11C may have a curved shape such as an arc shape.

Also, in this embodiment, the bonding materials 11 are disposed spaced apart from the outer peripheral edge of the package 12 by a predetermined distance. However, the bonding materials 11 may be formed so as to reach the outer peripheral edge of the package 12.

Also, in this embodiment, the four external electrode terminals (the first external electrode terminal 433, the second external electrode terminal 434, the third external electrode terminal 435 and the fourth external electrode terminal 436) are provided. However, the present invention is not limited thereto. The number of the external electrode terminals may be set to a desirable number as six terminals or eight terminals.

Figure 9:
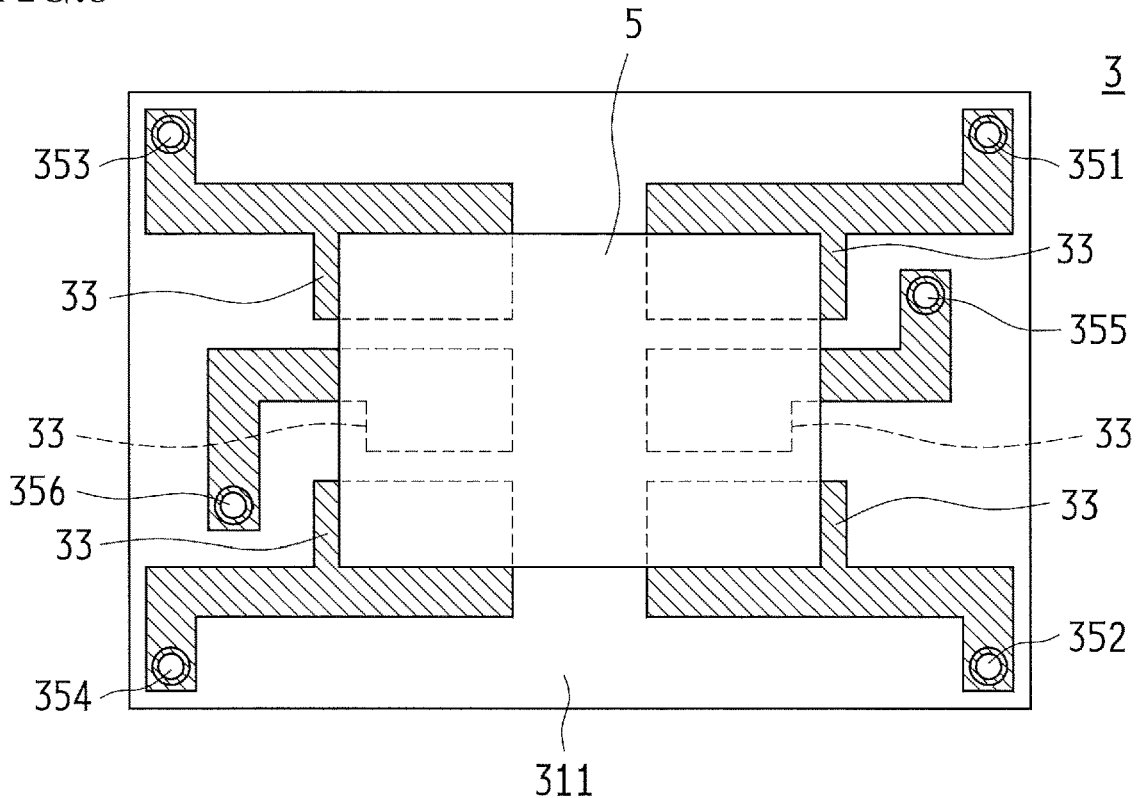
FIG. 9 is a schematic plan view illustrating a variation of the first sealing member of the crystal oscillator.
Figure 10:
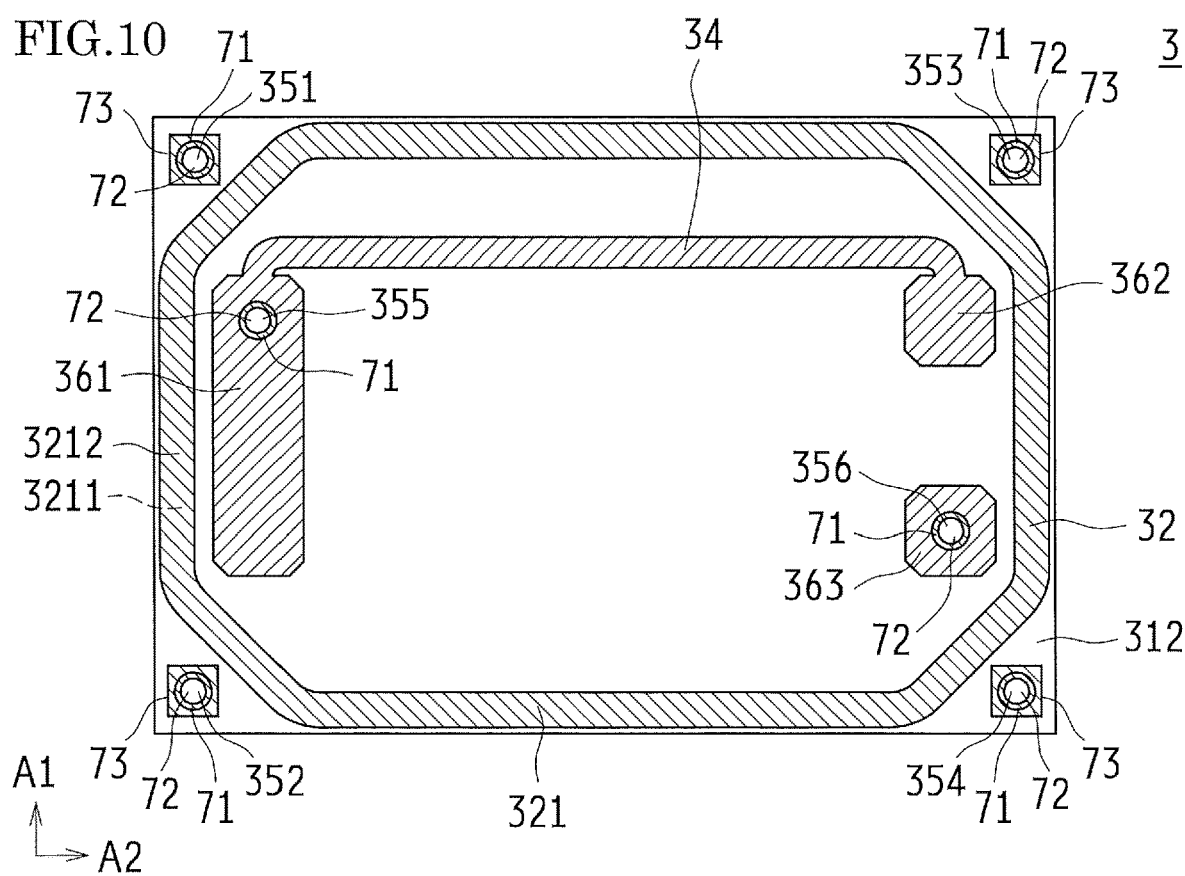
FIG. 10 is a schematic rear view illustrating a variation of the first sealing member of the crystal oscillator.
Figure 11:
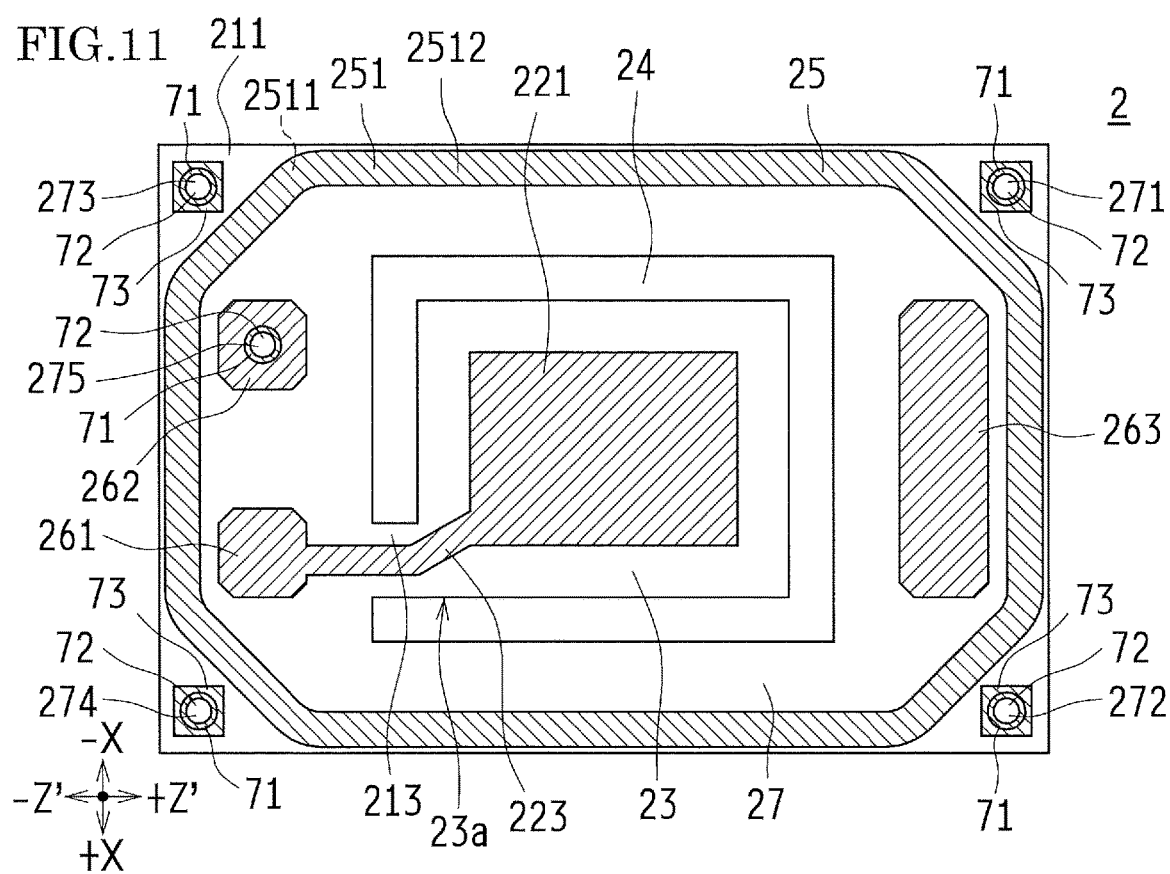
FIG. 11 is a schematic plan view illustrating a variation of the crystal resonator plate of the crystal oscillator.
Figure 12:
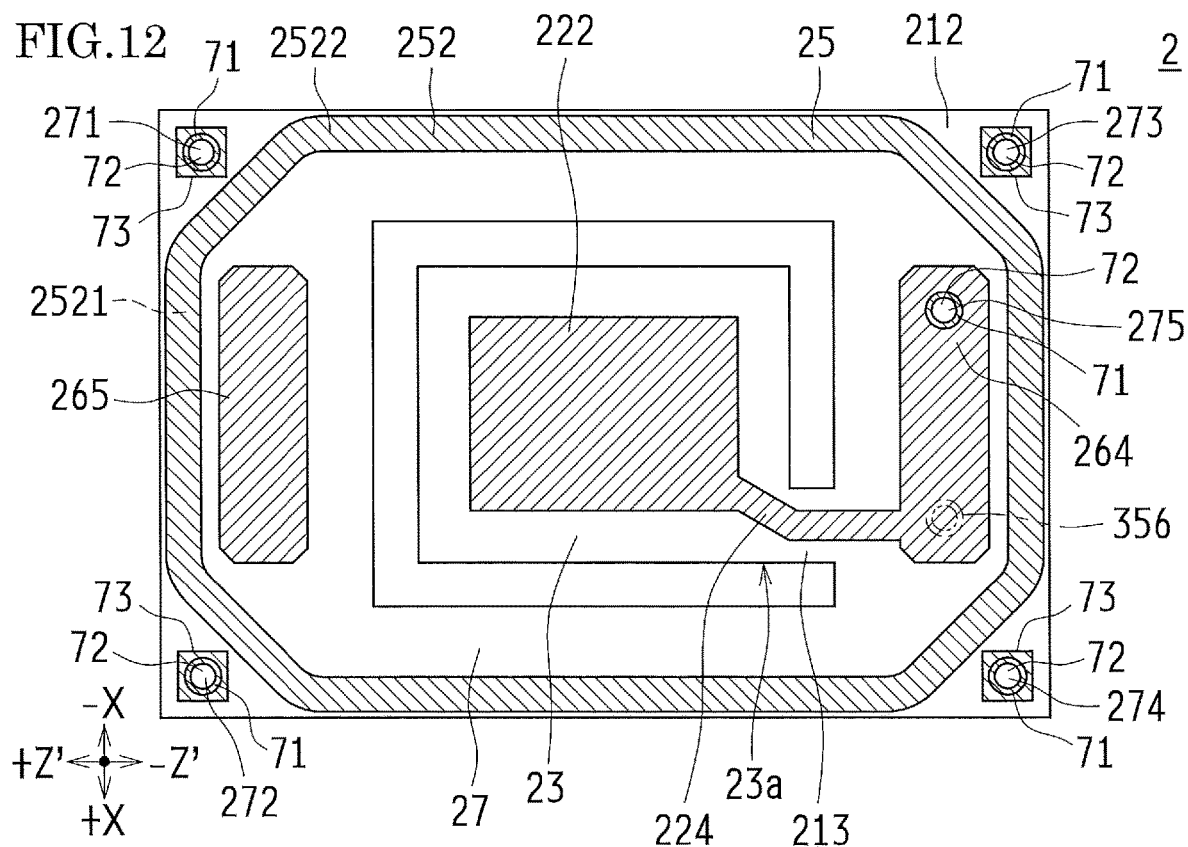
FIG. 12 is a schematic rear view illustrating a variation of the crystal resonator plate of the crystal oscillator.
Figure 13:
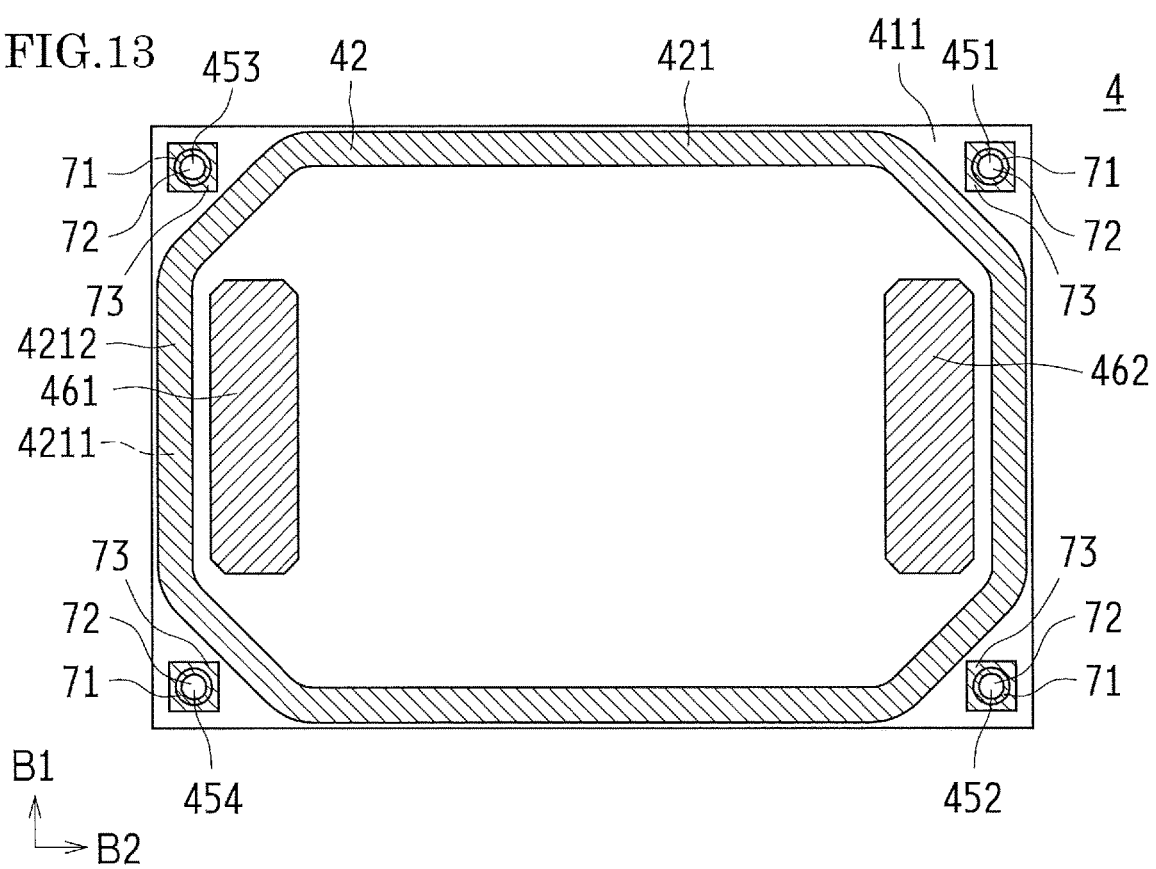
FIG. 13 is a schematic plan view illustrating a variation of the second sealing member of the crystal oscillator.
Figure 14:
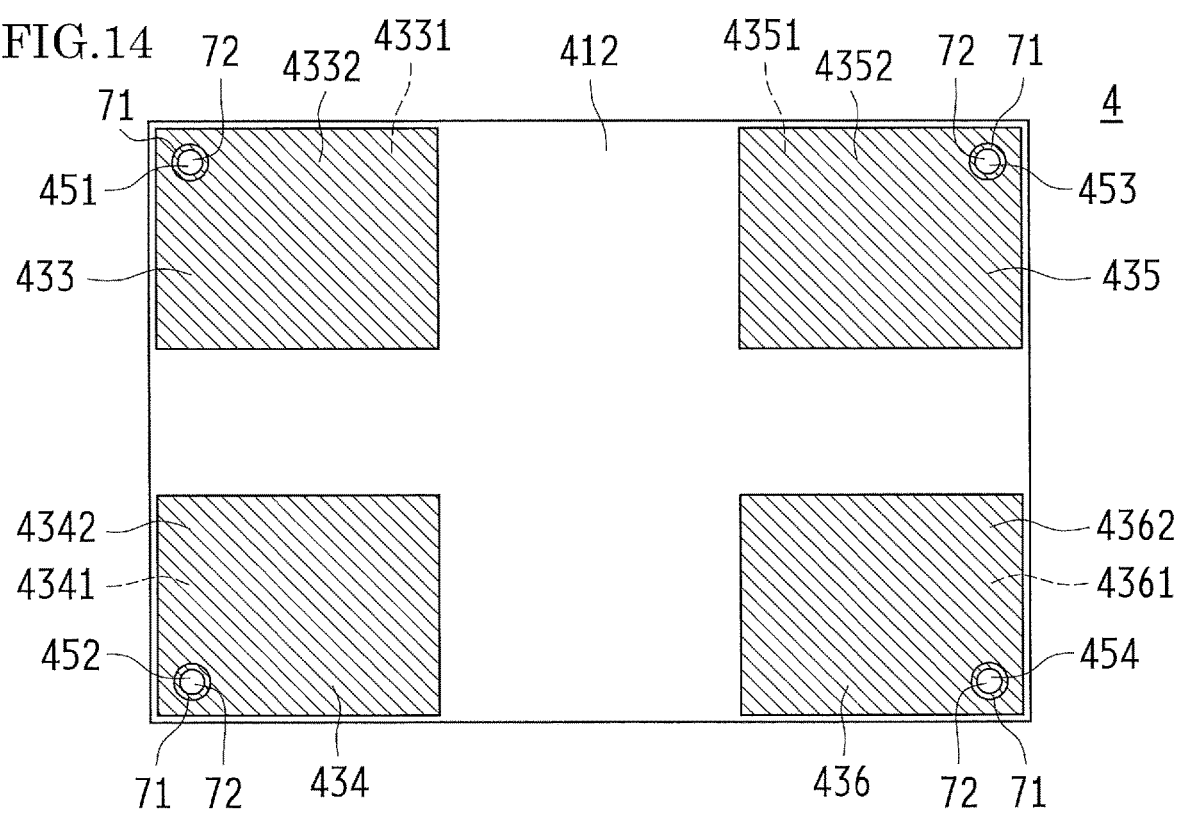
FIG. 14 is a schematic rear view illustrating a variation of the second sealing member of the crystal oscillator.
Figure 15:
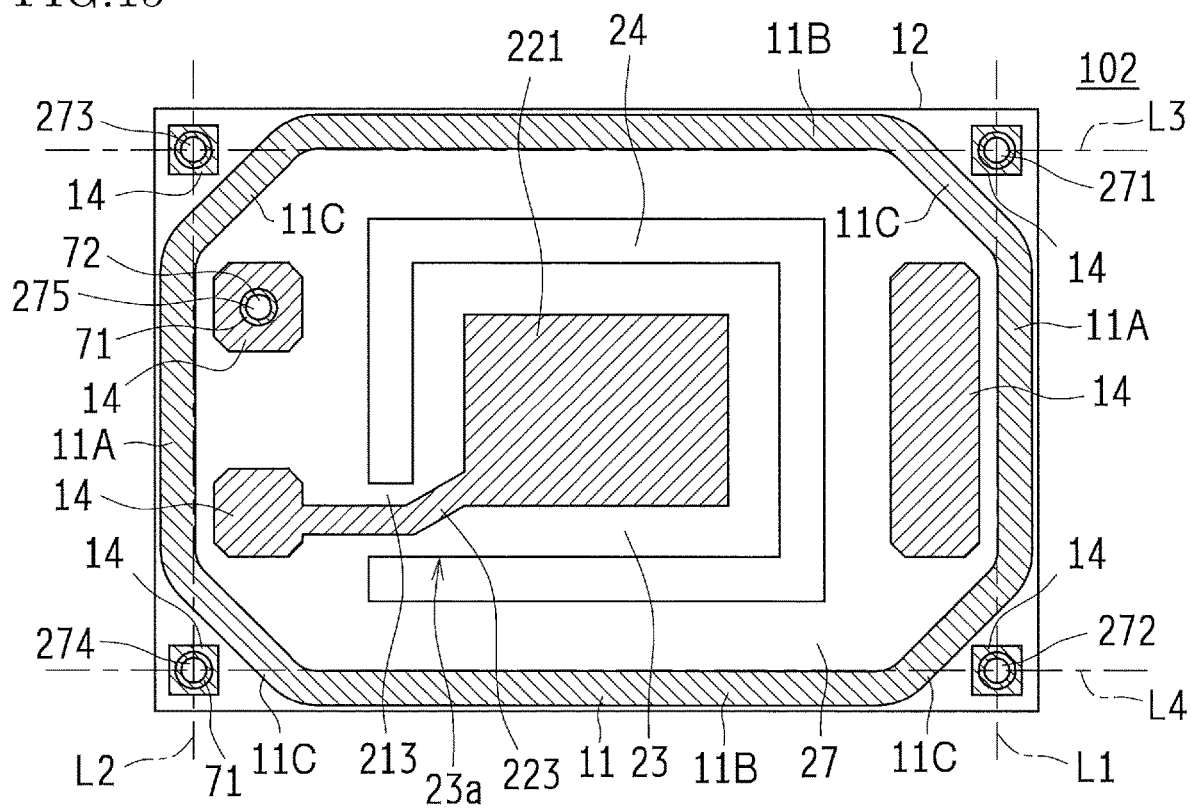
FIG. 15 is a diagram illustrating a positional relationship in plan view between the bonding material, and the vibrating part and the through holes of the crystal resonator plate in the crystal oscillator in the variation.

In the above-described embodiment, the configuration in which two support parts 213 and 213 are disposed in the crystal resonator plate 2 of the crystal oscillator 101 as the piezoelectric resonator device was described (see FIGS. 4 and 5). However, only one support part 213 may be disposed in the crystal resonator plate 2. A crystal oscillator 102 in this variation will be described with reference to FIGS. 9 to 15. FIG. 9 is a schematic plan view illustrating the variation of the first sealing member 3 of the crystal oscillator 102, which corresponds to FIG. 2. FIG. 10 is a schematic rear view illustrating the variation of the first sealing member 3 of the crystal oscillator 102, which corresponds to FIG. 3. FIG. 11 is a schematic plan view illustrating the variation of the crystal resonator plate 2 of the crystal oscillator 102, which corresponds to FIG. 4. FIG. 12 is a schematic rear view illustrating the variation of the crystal resonator plate 2 of the crystal oscillator 102, which corresponds to FIG. 5. FIG. 13 is a schematic plan view illustrating the variation of the second sealing member 4 of the crystal oscillator 102, which corresponds to FIG. 6. FIG. 14 is a schematic rear view illustrating the variation of the second sealing member 4 of the crystal oscillator 102, which corresponds to FIG. 7. FIG. 15 is a diagram illustrating a positional relationship in plan view between the bonding material, and the vibrating part and the through holes of the crystal resonator plate 2 in the crystal oscillator 102, which corresponds to FIG. 8. For convenience sake, the common configuration with the crystal oscillator 101 of the above embodiment (see FIGS. 1 to 8) is indicated by the same reference numerals, and the description thereof is omitted. Hereinafter, a description will be given mainly on the configuration of the crystal oscillator 102 according to this variation, which differs from the configuration of the crystal oscillator 101 of the above embodiment.

As shown in FIGS. 11 and 12, the crystal resonator plate 2 is provided with the single support part 213 that connects the vibrating part 23 to an external frame part 27 surrounding the outer periphery of the vibrating part 23. The support part 213 extends (protrudes) from only one corner part 23a that is positioned in the +X and −Z directions of the vibrating part 23 to the external frame part 27 in the −Z direction. Since only one support part 213 is disposed, the cut-out part 24 is continuously formed so as to surround the outer periphery of the vibrating part 23. Thus, the vibrating part 23 is coupled to the external frame part 27 via only the support part 213.

The first extraction electrode 223 extracted from the first excitation electrode 221 is provided on the first main surface of the support part 213. The second extraction electrode 224 extracted from the second excitation electrode 222 is provided on the second main surface of the support part 213. The first extraction electrode 223 is connected to an excitation electrode bonding pattern 261 formed on the first main surface of the external frame part 27 via the support part 213. The second extraction electrode 224 is connected to an excitation electrode bonding pattern 264 formed on the second main surface of the external frame part 27 via the support part 213. The excitation electrode bonding pattern 264 is a connection bonding pattern that is formed on the outer periphery of the fifteenth through hole 275. In this variation, only one support part 213 of the crystal resonator plate 2 is provided, and the first extraction electrode 223 and the second extraction electrode 224 extend in the same direction (the −Z direction). Therefore, this variation differs from the above-described embodiment in the wiring that connects the first excitation electrode 221 to the external electrode for the first excitation electrode, and in the wiring that connects the second excitation electrode 222 to the external electrode for the second excitation electrode.

In addition to the above-described excitation electrode bonding pattern 261, excitation electrode bonding patterns 262 and 263 are also formed on the first main surface 211 of the crystal resonator plate 2. The excitation electrode bonding patterns 262 and 263 are formed on the external frame part 27. The excitation electrode bonding pattern 262 is to apply a voltage to the second excitation electrode 222. In the excitation electrode bonding pattern 262, the fifteenth through hole 275 is formed so as to wire the second main surface 212 of the crystal resonator plate 2. The excitation electrode bonding patterns 261 and 262 are spaced apart from each other by a predetermined distance in the X axis direction. The excitation electrode bonding pattern 263 is located on the side, in the Z axis direction, opposite to the side on which the excitation electrode bonding patterns 261 and 262 are disposed, with the vibrating part 23 of the crystal resonator plate 2 being interposed therebetween. The excitation electrode bonding pattern 263 extends on the external frame part 27 of the crystal resonator plate 2 in the X axis direction.

On the second main surface 212 of the crystal resonator plate 2, a bonding pattern 265 is formed in addition to the above-described excitation electrode bonding pattern 264. The excitation electrode bonding pattern 264 and the bonding pattern 265 extend on the external frame part 27 of the crystal resonator plate 2 in the X axis direction. The excitation electrode bonding pattern 264 is connected to the excitation electrode bonding pattern 262 on the first main surface 211 via the fifteenth through hole 275. The bonding pattern 265 is located on the side, in the Z axis direction, opposite to the side on which the excitation electrode bonding pattern 264 is disposed, with the vibrating part 23 of the crystal resonator plate 2 being interposed therebetween.

The fifteenth through hole 275, the excitation electrode bonding patterns 261 to 264 and the bonding pattern 265 are disposed inside the resonator-plate-side first bonding pattern 251 and the resonator-plate-side second bonding pattern 252. The fifteenth through hole 275, the excitation electrode bonding patterns 261 to 264 and the bonding pattern 265 are not electrically connected to the resonator-plate-side first bonding pattern 251 and the resonator-plate-side second bonding pattern 252. Similarly to the above embodiment, in this variation, the resonator-plate-side first bonding pattern 251 and the resonator-plate-side second bonding pattern 252 are each formed so as to have an annular shape in plan view, and more specifically, their outer edges and inner edges each have a substantially octagon shape. Also, the eleventh through fourteenth through holes 271 through 275 and the bonding patterns 73 are disposed outside the resonator-plate-side first bonding pattern 251 and the resonator-plate-side second bonding pattern 252.

As shown in FIGS. 9 and 10, sealing-member-side excitation electrode bonding patterns 361 to 363 are formed on the second main surface 312 of the first sealing member 3. The sealing-member-side excitation electrode bonding patterns 361 and 363 are respectively conducted to the external electrodes 33 and 33 formed on the first main surface 311 of the first sealing member 3 via the electrodes in the twentieth through hole 355 and the twenty-first through hole 356. The sealing-member-side excitation electrode bonding patterns 363 is to apply a voltage to the first excitation electrode 221. In the sealing-member-side excitation electrode bonding pattern 363, the twenty-first through hole 356 is formed so as to wire the first main surface 311 of the first sealing member 3. The sealing-member-side excitation electrode bonding pattern 363 is connected to the excitation electrode bonding pattern 261 of the piezoelectric substrate 2.

The sealing-member-side excitation electrode bonding patterns 361 and 362 are to apply a voltage to the second excitation electrode 222. In the sealing-member-side excitation electrode bonding pattern 361, the twenty through hole 355 is formed so as to wire the first main surface 311 of the first sealing member 3. The sealing-member-side excitation electrode bonding pattern 361 is connected to the excitation electrode bonding pattern 263 of the crystal resonator plate 2. The sealing-member-side excitation electrode bonding pattern 362 is connected to the excitation electrode bonding pattern 262 of the crystal resonator plate 2. The sealing-member-side excitation electrode bonding pattern 361 extends in the A1 direction, and is integrally formed with a wiring pattern 34. The sealing-member-side excitation electrode bonding pattern 362 is located on the side, in the A2 direction, opposite to the side on which the sealing-member-side excitation electrode bonding pattern 361 is disposed, with the wiring pattern 34 being interposed therebetween. That is, the sealing-member-side excitation electrode bonding pattern 361 is connected to one end of the wiring pattern 34 in the A2 direction while the sealing-member-side excitation electrode bonding pattern 362 is connected to the other end of the wiring pattern 34 in the A2 direction. The sealing-member-side excitation electrode bonding pattern 362 is disposed spaced apart from the sealing-member-side excitation electrode bonding pattern 363 by a predetermined distance in the A1 direction. Also, the sealing-member-side excitation electrode bonding pattern 361 is located on the side, in the A2 direction, opposite to the side on which the sealing-member-side excitation electrode bonding pattern 363 is disposed.

The twentieth through hole 355, the twenty-first through hole 356, the sealing-member-side excitation electrode bonding patterns 361 to 363 and the wiring pattern 34 are disposed inside the sealing-member-side first bonding pattern 321. The twentieth through hole 355, the twenty-first through hole 356, the sealing-member-side excitation electrode bonding patterns 361 to 363 and the wiring pattern 34 are not electrically connected to the sealing-member-side first bonding pattern 321. Similarly to the above embodiment, in this variation, the sealing-member-side first bonding pattern 321 is formed so as to have an annular shape in plan view, and more specifically, its outer edge and inner edge each have a substantially octagon shape. Also, the sixteenth through nineteenth through holes 351 through 354 and the bonding patterns 73 are disposed outside the sealing-member side first bonding pattern 321.

As shown in FIGS. 13 and 14, a sealing-member-side excitation electrode bonding pattern 461 and a bonding pattern 462 are formed on the first main surface 411 of the second sealing member 4. The sealing-member-side excitation electrode bonding pattern 461 is connected to the excitation electrode bonding pattern 264 of the piezoelectric substrate 2. The bonding pattern 462 is connected to the bonding pattern 265 of the crystal resonator plate 2. The sealing-member-side excitation electrode bonding pattern 461 and the bonding pattern 462 extend in the B1 direction. The bonding pattern 462 is located on the side, in the B2 direction, opposite to the side on which the sealing-member-side excitation electrode bonding pattern 461 is disposed.

The sealing-member-side excitation electrode bonding pattern 461 and the bonding pattern 462 are disposed inside the sealing-member-side second bonding pattern 421. The sealing-member-side excitation electrode bonding pattern 461 and the bonding pattern 462 are not electrically connected to the sealing-member-side second bonding pattern 421. Similarly to the above embodiment, in this variation, the sealing-member-side second bonding pattern 421 is formed so as to have an annular shape in plan view, and more specifically, its outer edge and inner edge each have a substantially octagon shape. Also, the twenty-second through twenty-fifth through holes 451 through 454 and the bonding patterns 73 are disposed outside the sealing-member-side second bonding pattern 421.

Similarly to the above-described embodiment, in this variation, when bonding the first sealing member 3 to the crystal resonator plate 2, the resonator-plate-side first bonding pattern 251 of the crystal resonator plate 2 is overlapped with the sealing-member-side first bonding pattern 321 of the first sealing member 3, and the excitation electrode bonding patterns 261, 262 and 263 of the crystal resonator plate 2 are respectively overlapped with the sealing-member-side excitation electrode bonding patterns 363, 362 and 361 of the first sealing member 3. In this state, the respective metals are subjected to diffusion bonding. Also, when bonding the second sealing member 4 to the crystal resonator plate 2, the resonator-plate-side second bonding pattern 252 of the crystal resonator plate 2 is overlapped with the sealing-member-side second bonding pattern 421 of the second sealing member 4, the excitation electrode bonding pattern 264 of the crystal resonator plate 2 is overlapped with the sealing-member-side excitation electrode bonding pattern 461 of the second sealing member 4, and the bonding pattern 265 of the crystal resonator plate 2 is overlapped with the bonding pattern 462 of the second sealing member 4. In this state, the respective metals are subjected to diffusion bonding. Thus, the crystal oscillator 102 is produced, which includes the package 12 having a sandwich structure similar to the above-described embodiment (see FIG. 1). The wiring pattern 34 on the second main surface 312 of the first sealing member 3 is not bonded to any patterns on the first main surface 211 of the crystal resonator plate 2.

Similarly to the above embodiment, the resonator-plate-side first bonding pattern 251 and the sealing-member-side first bonding pattern 321 themselves become the bonding material 11 formed upon the diffusion bonding, as shown in FIG. 15. The resonator-plate-side second bonding pattern 252 and the sealing-member-side second bonding pattern 421 themselves become the bonding material 11 formed upon the diffusion bonding. The respective bonding materials 11 are formed so as to have an annular shape in plan view, and to have a substantially octagon shape as their respective outer edges and inner edges.

The first excitation electrode 221, the second excitation electrode 222 and the first through fourth external electrode terminals 433 through 436 in the crystal oscillator 102 are not electrically connected to the bonding materials 11 (i.e. the resonator-plate-side first bonding pattern 251 and the sealing-member-side first bonding pattern 321, and the resonator-plate-side second bonding pattern 252 and the sealing-member-side second bonding pattern 421) as the sealing parts for hermetically sealing the vibrating part 23. More specifically, the first excitation electrode 221 is electrically connected to the IC 5 via the first electrical path (the twenty-first through hole 356) and the electrode pattern 33 in this order. The second excitation electrode 222 is electrically connected to the IC 5 via the second electrical path (the fifteenth through hole 275, the wiring pattern 34 and the twenty through hole 355) and the electrode pattern 33 in this order. The first electrical path and the second electrical path are inner electrical paths that are disposed inside the bonding materials 11 in plan view.

The IC 5 is electrically connected to the first external electrode terminal 433 via the electrode pattern 33 and the third electrical path (the sixteenth through hole 351, the eleventh through hole 271 and the twenty-second through hole 451) in this order. The IC 5 is electrically connected to the second external electrode terminal 434 via the electrode pattern 33 and the fourth electrical path (the seventeenth through hole 352, the twelfth through hole 272 and the twenty-third through hole 452) in this order. The IC 5 is electrically connected to the third external electrode terminal 435 via the electrode pattern 33 and the fifth electrical path (the eighteenth through hole 353, the thirteenth through hole 273 and the twenty-fourth through hole 453) in this order. The IC 5 is electrically connected to the fourth external electrode terminal 436 via the electrode pattern 33 and the sixth electrical path (the nineteenth through hole 354, the fourteenth through hole 274 and the twenty-fifth through hole 454) in this order. The third through sixth electrical paths are outer electrical paths that are disposed outside the bonding materials 11 in plan view.

The sixteenth through hole 351, the eleventh through hole 271 and the twenty-second through hole 451, which constitute the third electrical path, are provided so as to be superimposed to each other in plan view. The seventeenth through hole 352, the twelfth through hole 272 and the twenty-third through hole 452, which constitute the fourth electrical path, are provided so as to be superimposed to each other in plan view. The eighteenth through hole 353, the thirteenth through hole 273 and the twenty-fourth through hole 453, which constitute the fifth electrical path, are provided so as to be superimposed to each other in plan view. The nineteenth through hole 354, the fourteenth through hole 274 and the twenty-fifth through hole 454, which constitute the sixth electrical path, are provided so as to be superimposed to each other in plan view. Thus, it is possible to ensure a large area for performing the FCB method when mounting the IC 5 on the first main surface 311 of the first sealing member 3 by the FCB method.

Similarly to the above-described embodiment, in the crystal oscillator 102 of this variation, the bonding materials 11 as the sealing parts are disposed along the outer peripheral edge of the package 12 excluding the four corners of the package 12 in plan view. The outer edge and the inner edge of the bonding materials 11 each have a substantially octagon shape. Also, the outer edge and the inner edge of the bonding materials 11 each have the same shape as the respective outer edges of the resonator-plate-side first bonding pattern 251, the resonator-plate-side second bonding pattern 252, the sealing-member-side first bonding pattern 321 and the sealing-member-side second bonding pattern 421 (see FIGS. 10 to 13).

Specifically, as shown in FIG. 15 in plan view, the bonding material 11 is constituted by: a pair of first linear portions 11A disposed along (in parallel with) a pair of short sides of the package 12; a pair of second linear portions 11B disposed along (in parallel with) a pair of long sides of the package 12; and four connecting portions 11C disposed so as to connect end parts of the first linear portions 11A to end parts of the second linear portions 11B. The pair of first linear portions 11A and the pair of second linear portions 11B are outer edge portions along the outer peripheral edge (i.e. the short sides and the long sides) of the package 12. The connecting portions 11C extend substantially in parallel with either of the two diagonals of the package 12. That is, each connecting portion 11C is disposed so as to intersect with the corresponding diagonal of the package 12 in plan view. The length of the connecting portions 11C is shorter than the length of the above-described first linear portions 11A and the length of the above-described second linear portions 11B. The positional relationship in plan view between the bonding material 11, and the vibrating part 23 and the through holes of the crystal resonator plate 2 is substantially the same as that in the above-described embodiment (see FIG. 8).

As described above, in the crystal oscillator 102 of this variation, the bonding materials 11 are disposed along the outer peripheral edge of the package 12 excluding the four corners of the package 12 in plan view, and the through holes (the eleventh through fourteenth through holes 271 through 274, the sixteenth through nineteenth through holes 351 through 354 and the twenty-second through twenty-fifth through holes 451 through 454) are disposed outside the bonding materials 11 in plan view. Thus, with the crystal oscillator 102 of this variation, it is possible to obtain the same functions and effects as those provided by the crystal oscillator 101 in the above-described embodiment.

This application claims priority based on Patent Application No. 2015-119039 filed in Japan on Jun. 12, 2015. The entire contents thereof are hereby incorporated in this application by reference.

INDUSTRIAL APPLICABILITY

The present invention is suitable for a piezoelectric resonator device having a sandwich structure made by laminating and bonding a first sealing member and a second sealing member via a piezoelectric resonator plate.

DESCRIPTION OF REFERENCE NUMERALS

101 Crystal oscillator
11 Bonding material (sealing part)
12 Package
13 Internal space
2 Crystal resonator plate
221 First excitation electrode
222 Second excitation electrode
23 Vibrating part
271-274 First through fourth through holes (outer through holes)
3 First sealing member
4 Second sealing member
5 IC (external element)

The invention claimed is:

1. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate;
a second sealing member covering the second excitation electrode of the piezoelectric resonator plate; and
a substantially rectangular parallelepiped shaped package formed by bonding the first sealing member to the piezoelectric resonator plate and by bonding the second sealing member to the piezoelectric resonator plate, the package including an internal space in which is sealed a vibrating part of the piezoelectric resonator plate including the first excitation electrode and the second excitation electrode,
wherein a sealing part hermetically sealing the vibrating part of the piezoelectric resonator plate is formed so as to have an annular shape in plan view, and furthermore is disposed along an outer peripheral edge of the package excluding four corners of the package.

2. The piezoelectric resonator device according to claim 1,
wherein outer through holes are formed respectively in the four corners of the package so as to penetrate between the first main surface and the second main surface of the piezoelectric resonator plate, and
wherein, in the sealing part, respective outer edge portions along the outer peripheral edge of the package are formed closer to the outer peripheral edge of the package in plan view than respective straight lines connecting centers of two of the outer through holes are.

3. The piezoelectric resonator device according to claim 2,
wherein a plurality of wiring patterns is formed on a first main surface of the first sealing member so as to be electrically connected to an external element, and
wherein a plurality of external electrode terminals is formed on a second main surface of the second sealing member so as to be electrically connected to an external circuit board,
wherein outer through electrodes are respectively formed in the outer through holes so as to establish conduction between electrodes formed on the first main surface and the second main surface of the piezoelectric resonator plate, and wherein the wiring patterns and the external electrode terminals are electrically connected to each other via outer electrical paths including the outer through electrodes.

4. The piezoelectric resonator device according to claim 1, wherein a first through hole is formed in the first sealing member so as to penetrate between a first main surface and a second main surface of the first sealing member, and the first through hole includes a first through electrode configured to: establish conduction between electrodes formed on the first main surface and the second main surface of the first sealing member; and further be electrically connected to the first excitation electrode of the piezoelectric resonator plate, wherein a second through hole is formed in the piezoelectric resonator plate so as to penetrate between the first main surface and the second main surface of the piezoelectric resonator plate, and the second through hole includes a second through electrode configured to: establish conduction between electrodes formed on the first main surface and the second main surface of the piezoelectric resonator plate; and further be electrically connected to the second excitation electrode of the piezoelectric resonator plate, and wherein the first through electrode and the second through electrode are respectively formed, in plan view, inside the sealing part and furthermore are not electrically connected to the sealing part.

5. The piezoelectric resonator device according to claim 1, wherein an outer edge of the sealing part has an octagon shape in plan view.

* * * * *